United States Patent
Liang

(10) Patent No.: US 11,057,692 B1
(45) Date of Patent: Jul. 6, 2021

(54) DRIVING CIRCUIT FOR SOUND PRODUCING DEVICE

(71) Applicant: xMEMS Labs, Inc., Santa Clara, CA (US)

(72) Inventor: Jemm Yue Liang, Sunnyvale, CA (US)

(73) Assignee: xMEMS Labs, Inc., Santa Clara, CA (US)

( * ) Notice: Subject to any disclaimer, the term of this patent is extended or adjusted under 35 U.S.C. 154(b) by 0 days.

(21) Appl. No.: 17/133,655

(22) Filed: Dec. 24, 2020

Related U.S. Application Data

(60) Provisional application No. 63/033,713, filed on Jun. 2, 2020, provisional application No. 63/029,074, filed on May 22, 2020, provisional application No. 62/969,014, filed on Jan. 31, 2020.

(51) Int. Cl.
*H04R 25/00* (2006.01)
*H04R 1/02* (2006.01)

(52) U.S. Cl.
CPC .......... *H04R 1/02* (2013.01); *H04R 2400/13* (2013.01); *H04R 2499/11* (2013.01)

(58) Field of Classification Search
CPC ... H04R 1/02; H04R 2400/13; H04R 2499/11
See application file for complete search history.

(56) References Cited

U.S. PATENT DOCUMENTS

| | | | |
|---|---|---|---|
| 9,637,374 B2 | 5/2017 | Jenkins | |
| 10,313,800 B2 | 6/2019 | Deas | |
| 10,327,060 B2 | 6/2019 | Lo | |
| 10,408,821 B2 | 9/2019 | Nath | |
| 10,425,732 B1 | 9/2019 | Liang | |
| 10,484,784 B1 | 11/2019 | Liang | |
| 10,536,770 B1 | 1/2020 | Liang | |
| 10,547,952 B1 | 1/2020 | Liang | |
| 10,567,866 B1 * | 2/2020 | Liang | H04R 7/14 |
| 10,771,893 B1 | 9/2020 | Liang | |
| 10,779,088 B1 | 9/2020 | Liang | |
| 10,783,866 B1 | 9/2020 | Liang | |
| 2016/0381464 A1 | 12/2016 | Elyada | |
| 2017/0201192 A1 | 7/2017 | Tumpold | |
| 2019/0047847 A1 | 2/2019 | Khenkin | |
| 2019/0238974 A1 | 8/2019 | Hong | |
| 2019/0313189 A1 * | 10/2019 | Liang | H04R 1/2823 |
| 2020/0059719 A1 | 2/2020 | Liang | |
| 2020/0288248 A1 | 9/2020 | Liang | |

\* cited by examiner

*Primary Examiner* — Phylesha Dabney

(74) *Attorney, Agent, or Firm* — Winston Hsu

(57) ABSTRACT

A driving circuit is disclosed. The driving circuit includes a first node, coupled to at least a first air pulse generating element, wherein the driving circuit produces a first driving signal to the at least a first air pulse generating element via the first node; a second node, coupled to at least a second air pulse generating element, wherein the driving circuit produces a second driving signal to the at least a second air pulse generating element via the second node; a first swapping module, coupled to the first node and the second node, configured to be conducted within a first conduction interval; wherein a first voltage level at the first node and a second voltage level at the second node are substantially swapped after the first conduction interval.

28 Claims, 29 Drawing Sheets

US 11,057,692 B1

DRIVING CIRCUIT FOR SOUND PRODUCING DEVICE

CROSS REFERENCE TO RELATED APPLICATIONS

This application claims the benefit of U.S. provisional application No. 62/969,014, filed on Jan. 31, 2020, U.S. provisional application No. 63/029,074, filed on May 22, 2020, and U.S. provisional application No. 63/033,713, filed on Jun. 2, 2020, which are incorporated herein by reference.

BACKGROUND OF THE INVENTION

1. Field of the Invention

The present application relates to a driving circuit, and more particularly, to a driving circuit capable of reducing power consumption.

2. Description of the Prior Art

Conventionally, to cover a full range of human audible frequencies, e.g., from 20 Hz to 20 kHz, tweeter(s), mid-range speaker (s) and woofer(s) have to be incorporated within a conventional speaker set. All these devices would occupy large space of the conventional speaker set and will also raise its production cost. Hence, one of the design challenges for the conventional speaker is the impossibility to use a single sound producing device to cover the full range of human audible frequency.

Another design challenge for producing high-fidelity sound by the conventional speaker is its enclosure. The speaker enclosure is often used to contain the back-radiating wave of the produced sound to avoid cancelation of the front radiating wave in certain frequencies where the corresponding wavelengths of the sound are significantly larger than the speaker dimensions. The speaker enclosure can also be used to help improve, or reshape, the low-frequency response. Therefore, with properly selected speaker driver and enclosure parameters, the combined enclosure-driver resonance peaking can be leveraged to boost the output of sound around the resonance frequency and therefore improve the performance of resulting speaker.

However, when the speaker enclosure's internal volume is not sufficiently large, the ratio of the air volume movement to the volume of the enclosure rises and the pressure fluctuation inside the enclosure also rises, which causes nonlinearity or distortion of membrane movement near the min-max peaks of its movement range. To avoid these problems, the conventional speaker enclosures are expected to contain sufficiently large volumes. For most high-fidelity speakers, the internal enclosure volumes are therefore generally vastly larger than the physical volumes of their speaker drivers.

Recently, micro-speakers are expected to be contained within devices such as smartphones, tablet notebooks, smartwatches, smartglasses, etc. In any of such compact devices, the volume of speaker is usually made extremely small because of the size constraint of its host devices. But, if the conventional speaker has a reduced size, the quality/fidelity of the sound produced by the conventional speaker is drastically degraded because of the above issues.

Therefore, how to overcome the design challenges is an important objective in the field.

SUMMARY OF THE INVENTION

It is therefore a primary objective of the present application to provide a driving circuit, to improve over disadvantages of the prior art.

An embodiment of the present application discloses a driving circuit, configured to drive at least a first air pulse generating element and at least a second air pulse generating element within a sound producing device. The driving circuit comprises a first node, coupled to the at least a first air pulse generating element, wherein the driving circuit produces a first driving signal to the at least a first air pulse generating element via the first node; a second node, coupled to the at least a second air pulse generating element, wherein the driving circuit produces a second driving signal to the at least a second air pulse generating element via the second node; a first swapping module, coupled to the first node and the second node, configured to be conducted within a first conduction interval; wherein a first voltage level at the first node and a second voltage level at the second node are substantially swapped after the first conduction interval.

An embodiment of the present application further discloses a driving circuit, configured to generate a plurality of driving signals to drive a sound producing device comprising a plurality of air pulse generating elements. The driving circuit comprises at least a swapping module, coupled between a plurality of nodes; wherein the plurality of nodes is coupled to a plurality of air pulse generating elements; wherein within a first conduction interval, a first amount of electrons is transferred from a first node; wherein within a second conduction interval, a second amount of electrons is transferred back to the first node.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
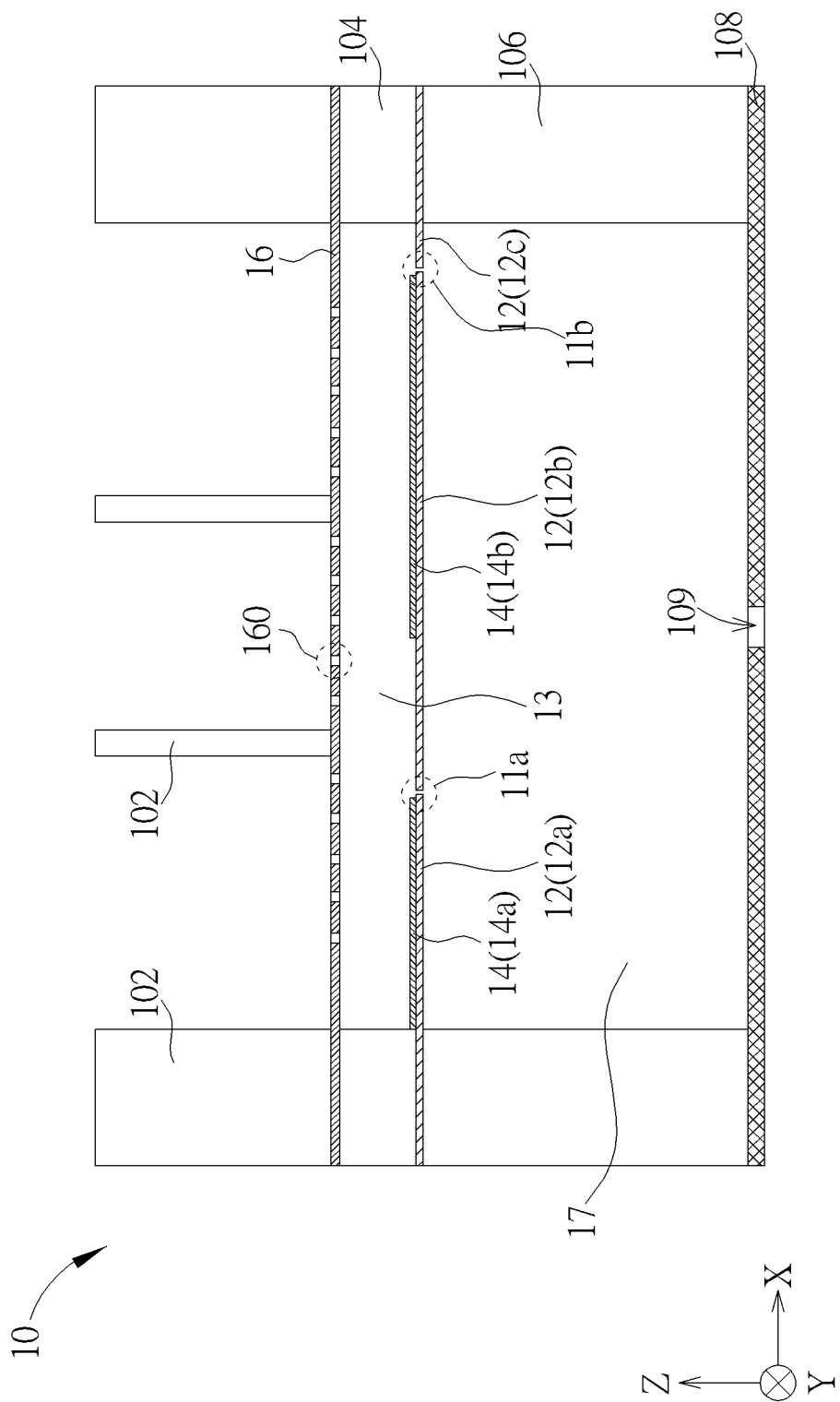
FIG. 1 is a schematic diagram of a cross sectional view of an air pulse generating element according to an embodiment of the present application.

U.S. Pat. No. 10,425,732 filed by Applicant provides a sound producing device comprising a plurality of air pulse generating elements which is capable of producing a plurality of PAM (pulse-amplitude modulation) air pulses at an ultrasonic pulse rate, higher than an maximum human audible frequency.

U.S. Pat. No. 10,771,893 filed by Applicant provides a SEAM (single ended amplitude modulation) driving signal for a sound producing device capable of producing single-ended PAM air pulses at ultrasonic pulse rate, in order to further enhance the sound pressure level performance and low audio frequency response. The SEAM driving signal comprises a plurality of electrical pulses, where the plurality of electrical pulses has the same polarity compared to (or with respect to) a certain voltage. For SEAM driving signal, each electrical pulse cycle comprises a PAM phase and an RST (reset) phase, which will be illustrated later on. The SEAM driving signal may be a PAM signal within the PAM phase and return to a reset voltage within the RST phase.

U.S. application Ser. No. 16/802,569 filed by Applicant provides a sound producing device which produces air pulses via chamber compression/expansion excited by membrane movement and the air pulses are propagated via through holes or openings formed either on the membrane or on a plate of the sound producing device, in order to achieve significant air pressure with small size/dimension of the sound producing device.

In application Ser. No. 16/802,569, each air pulse cycle comprises a pulse-generating time segment and a pulse-isolation time segment, and the compressed/expanded chamber air pressure (generated within the pulse-generating time segment) would be balanced with/to an ambient air pressure only through the opening(s), which requires long pressure balancing time, a time for the device to balance the chamber air pressure with/to the ambient air pressure.

The long pressure balancing time causes the pressure variation within the pulse-generating time segment to be canceled by the pressure variation within the pulse-isolation time segment. Thereby, a net pressure generated over the air pulse generating cycle would be small, which degrades the sound pressure level (SPL) performance in the human audible frequency band. In addition, when the pulse cycle ends before the pressure balancing time ends, significant residual air pressure may remain within the chamber at the end of the air pulse cycle, which leads to inter-pulse interference and causes degradation of sound quality. On the other hand, lengthen the pressure balancing time of RST phase will reduce the duty factor of PAM phase, leading to lower effective SPL over the pulse cycle.

To overcome the disadvantages stated in the above, the present application provides an air pulse generating element and a sound producing device capable of reducing the pressure balancing time by accelerating the speed of airflow, during the RST phase, between the volume inside the chamber and the ambient outside of the chamber and therefore speeding up the process of pressure balancing, reducing the time required to achieve balance, minimizing residual pressure at the end of RST phase, and therefore enhancing the net pressure to further enhance SPL performance while reducing inter pulse-cycle modulation.

FIG. 1 is a schematic diagram of a cross sectional view of an air pulse generating element 10 according to an embodiment of the present application. The air pulse generating element 10 comprises a membrane 12, an actuator 14, and a plate 16. A chamber 13 is formed between the membrane 12, the plate 16 and the spacer 104. The actuator 14 is disposed on the membrane 12. Openings/orifices 160, regarded as pressure ejection orifices (PEOs), are formed on the plate 16. The orifices 160 may be, but not limited thereto, formed by an etching process, and are permanently opened.

Similar to U.S. Pat. Nos. 10,425,732 and 10,771,893, or application Ser. No. 16/802,569, the air pulse generating element 10 is able to generate a plurality of air pulses. The air pulses generated by the air pulse generating element 10 would have non-zero offset in terms of SPL, where the non-zero offset is a deviation from a zero SPL, representing a pressure value of an ambient pressure outside the air pulse generating element 10. Also, the plurality of air pulses generated by the air pulse generating element 10 may be aperiodic over a plurality of pulse cycles.

Similar to application Ser. No. 16/802,569, the membrane 12 is actuated to cause membrane displacement. The membrane displacement of the membrane 12 may compress or expand a chamber volume of the chamber 13, to change a chamber pressure of the chamber 13 within an air pulse cycle $T_{CY,A}$, such that an ultrasonic air pressure pulse is generated and propagated to the ambient outside of element 10 via the orifices 160. Details of generating air pulse via chamber compression/expansion through orifices/openings may be referred to Ser. No. 16/802,569, which is not narrated herein for brevity.

Different from application Ser. No. 16/802,569, gap(s) is temporarily formed on the membrane 12 during the RST phase. The temporarily formed gap(s), during the RST phase, is configured to provide a temporary shunt to accelerate an air pressure balancing process between two sides of the membrane 12.

In the description and claims of the present application, "slit" or "slit opening" shall refer to the opening widthwise along the cuts through membrane 12, being parallel to the X-Y plane. "Gap" or "gap opening" shall refer to the opening along the Z direction, the direction of membrane displacement, between membrane portions, perpendicular to the X-Y plane.

In an embodiment, in order to form the gap(s), slit(s) may be formed on the membrane, which is to create another airflow passage way (in addition to the ones through the orifices 160), especially for accelerating the balancing of the chamber air pressure and/versus an ambient air pressure during RST phase of a pulse generating cycle. By driving the actuator 14 appropriately, gap opening may be temporarily formed to create a shunt between the 2 sides of membrane 12, connecting the pressure/volume above the membrane 12 in the charmer 13 with the pressure/volume below the membrane 12 in the chamber 17, to speed up the pressure balancing process, reduce the pressure balancing time and minimize the residual pressure at the end of the pulse cycle.

Figure 2:
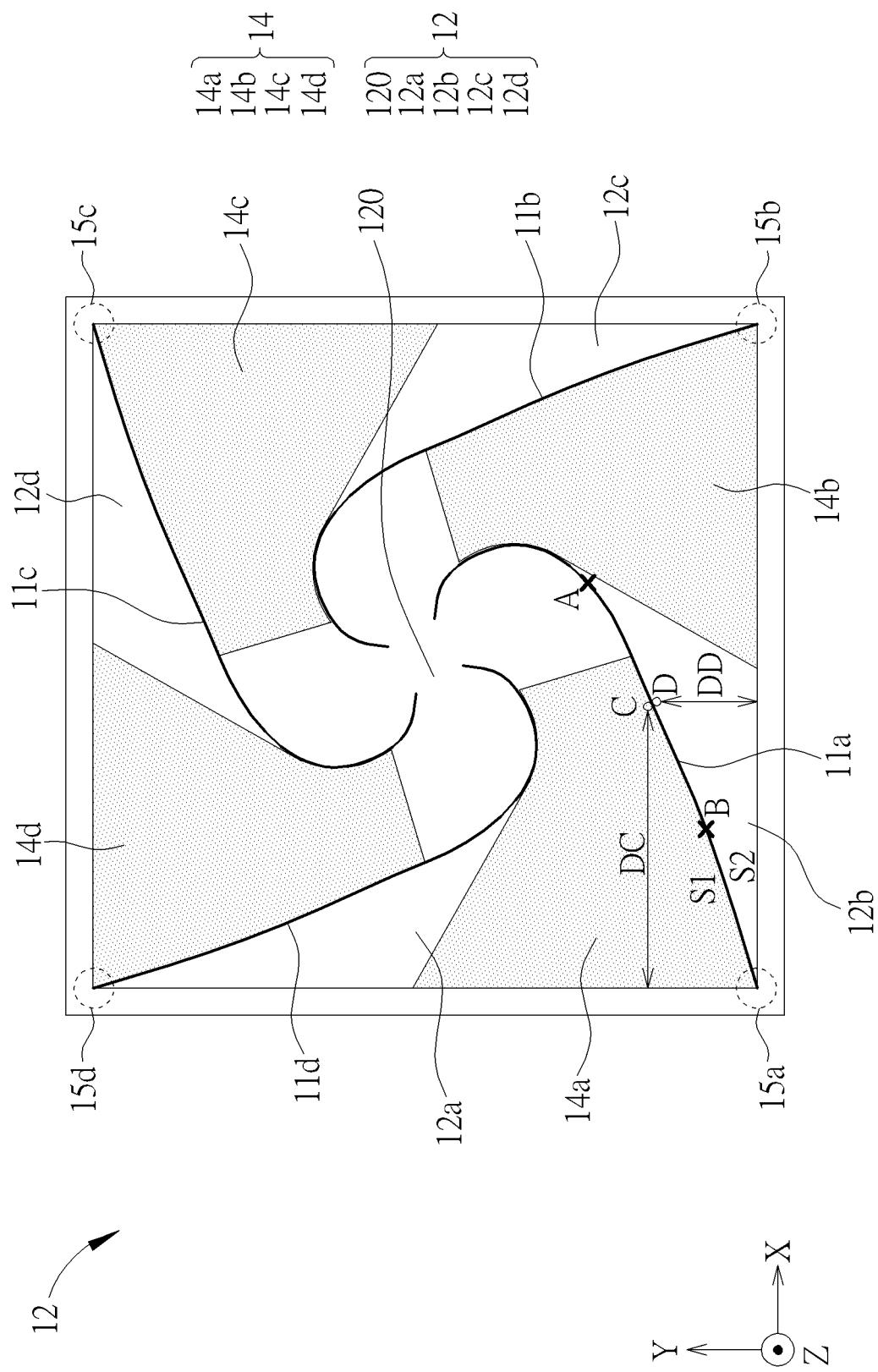
FIG. 2 is a schematic diagram of a top view of a membrane according to an embodiment of the present application.

For example, FIG. 2 is a schematic diagram of a top view of the membrane 12 according to an embodiment of the present application. As shown in FIG. 2, slits 11a, 11b, 11c and 11d are formed on the membrane 12. The slits 11a, 11b, 11c and 11d partition the membrane 12 into membrane portions 12a, 12b, 12c and 12d. That is, the membrane portion 12a is between the slits 11d and 11a, the membrane portion 12b is between the slits 11a and 11b, and so on and so forth. The actuator 14 comprises actuating portions 14a, 14b, 14c and 14d disposed on the membrane portions 12a, 12b, 12c and 12d, respectively.

Take the slit 11a as an example, the slit 11a is formed between the membrane portions 12a and 12b. In other words, the membrane portion 12a and the actuating portion 14a are at a first side S1 of the slit 11a, and the membrane portion 12b and the actuating portion 14b are at a second side S2 of the slit 11a. When the membrane portions 12a and 12b are sufficiently actuated (or the actuating portions 14a and 14b are sufficiently driven), a first displacement Uz_a of the membrane portion 12a along the Z direction by the first side S1 is significantly larger than a second displacement Uz_b of the membrane portion 12b along the Z direction by the second side S2, such that a gap 110a is (temporarily) formed. The Z direction is parallel to the Z axis and perpendicular to the XY plane, and the membrane 12 is parallel to the XY plane when the membrane 12 is not actuated (or when the membrane 12 is at a neutral state). The size of the gap 110a is determined by a membrane displacement difference $\Delta Uz = |Uz\_a - Uz\_b|$ between two sides of the slit 11a. The larger is the difference $\Delta Uz$, the wider will be the gap 110a.

Figure 3:
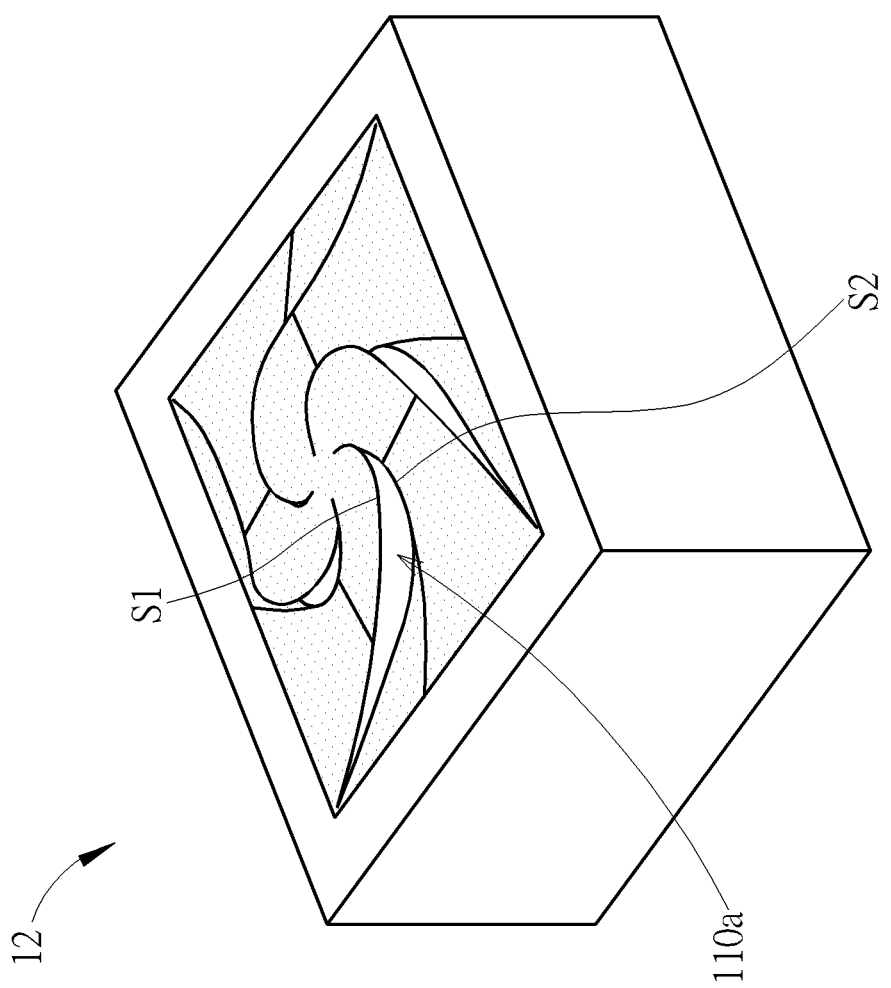
FIG. 3 is a schematic diagram of a perspective view of a membrane when the membrane is actuated according to an embodiment of the present application.

A status of the slit openings being formed can be visualized by FIG. 3. FIG. 3 is a schematic diagram of a 3D perspective view of the membrane 12 when the membrane 12, including portions 12a and 12b, is sufficiently actuated. As can be seen from FIG. 3, the gap 110a is clearly formed/opened. The gap 110a will be formed/opened when the membrane displacement difference $\Delta Uz$ is significantly large, i.e., larger than a thickness of the membrane 12. In the present application, the membrane portions 12a and 12b being sufficiently actuated and the actuating portions 14a and 14b being sufficiently driven indicate that the resulting displacement difference $\Delta Uz$ is larger than the membrane thickness and the gap 110a is formed/opened, so that the air pressure in compression chamber 13 above membrane 12 may be balanced with/to the air pressure below membrane 12, such as in the chamber 17 of FIG. 1, by connecting these two volumes to each other directly via the gap 110a.

The width of slit, in the X-Y plane, is generally around 1µm. The shape/pattern of the slit (e.g., 11a) is not limited. For example, in the embodiment illustrated in FIG. 2, the slit 11a extends toward a central portion 120 of the membrane 12, e.g., from a corner 15a. The slit 11a may comprise a straight segment close to the membrane corner 15a and a curved segment close to the central portion 120 of membrane 12. The slit 11a may form as a hook pattern, and the slits 11a-11d forms as a vortex pattern. A curvature of the slit 11a may increase as the slit 11a extending from the corner 15a toward the central portion 120. Specifically, a first radius of curvature at a first point A on the slit 11a is smaller than a second radius of curvature at a second point B on the slit 11a, where the point A is farther away from the corner 15a compared to the point B, i.e., and a first length along the slit 11a between the point A and the corner 15a is larger than a second length along the slit 11a between the point B and the corner 15a.

Rationale of forming the gap openings is described below. Refer to points C and D illustrated in FIG. 2. The point C is located on the membrane portion 12a by the S1 side of slit 11a, and the point D is located on the membrane portion 12b by the S2 side of slit 11a. The point D is opposite to the point C. The displacement Uz_a of the membrane portion 12a at the point C is driven by the actuating portion 14a and the displacement Uz_b of the membrane portion 12b at the point D is driven by the actuating portion 14b. A distance DC from the point C to an anchor edge of the membrane portion 12a is longer than a distance DD from the point D to an anchor edge of the membrane portion 12b. Since less distance implies stronger stiffness, deformation at the point D would be less than deformation of the point C, even applying the same driving force. In addition, the arrow DC overlaps with the region of the actuating portion while the arrow DD does not, which implies that the driving force applied at the point C is stronger than which at the point D. Combining those factors, the displacement Uz_a of the membrane portion 12a at the point C, where driving force strength is stronger while stiffness is lower, would be larger than the displacement Uz_b of the membrane portion 12b at the point D.

Figure 4:
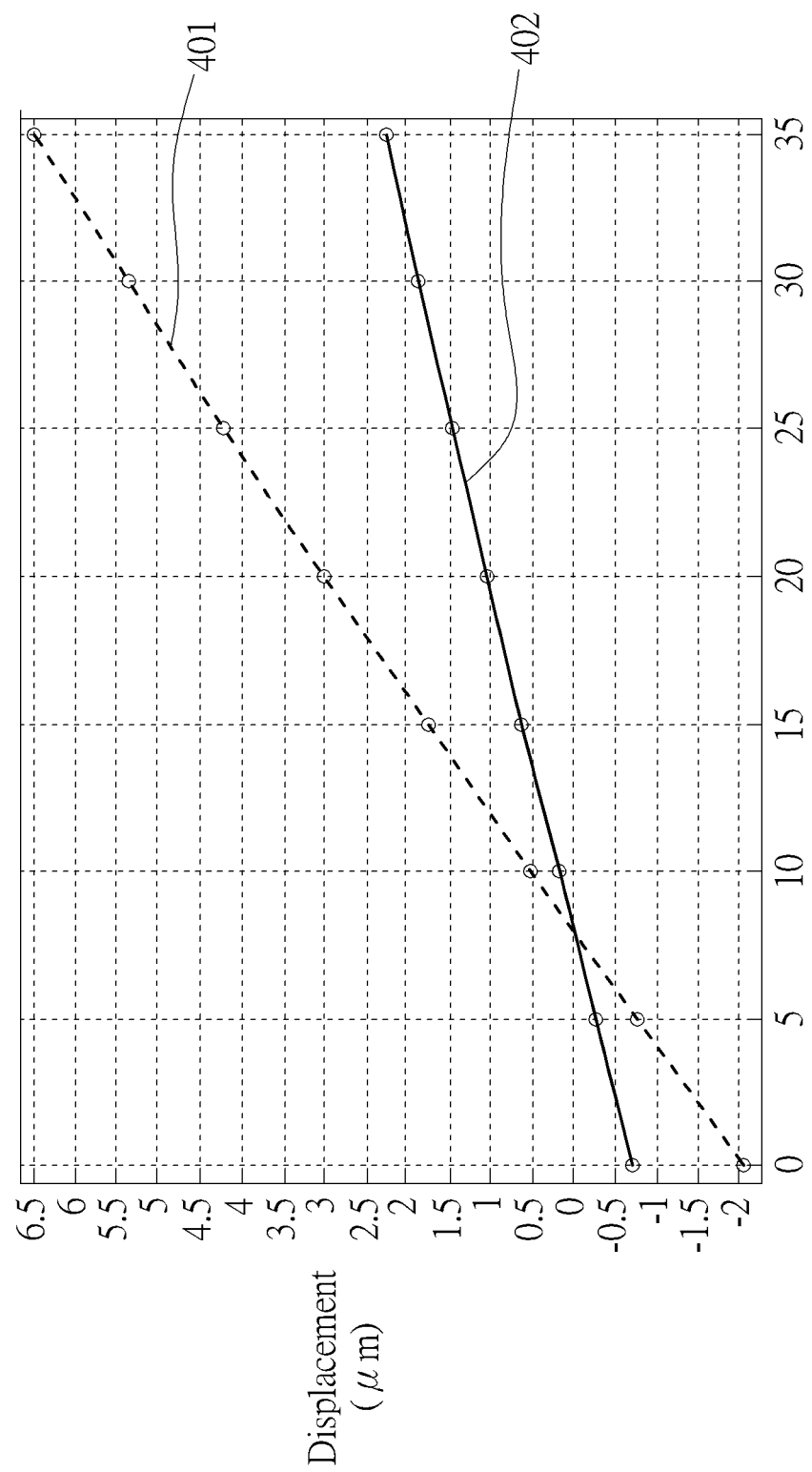
FIG. 4 illustrates two lines representing membrane displacement versus driving voltage applied on an actuator.

The FEM (Finite Element Method) simulation results of an embodiment of FIG. 3 is shown in FIG. 4, where lines 401-402 representing the membrane displacement versus the applied voltage driving the actuator 14. The line 401 represents an average of the displacement Uz_a by the side S1 along the slit 11a, and the line 402 represents an average of the displacement Uz_b by the side S2 along the slit 11a.

According to the results shown in FIG. 4, it represents that the slope of the line 401 is significantly greater/steeper than which of the line 402, and thus, a gap (e.g., 110a) would be developed (i.e., opened or formed) when the driving voltage applied to the actuator 14 (including the actuating portions 14a and 14b) is sufficiently large, where the applied voltage being sufficiently large means that the membrane displacement difference is larger than the thickness of the membrane 12.

Furthermore, the membrane portion 12a may have a first edge by the side S1 along the slit 11a, and the membrane portion 12b may have a second edge by the side S2 along the slit 11a. The second edge may be far away from the actuating portion 14b compared to the first edge and the actuating portion 14a. For example, a first distance between the first edge and the actuating portion 14a is less than a second distance between the second edge and the actuating portion 14b. In this case, a first slope corresponding to a first edge of the membrane portion 12a, representing a first relationship between a first displacement of the membrane portion 12a along the first edge versus the applied voltage, is steeper than a second slope corresponding to a second edge of the membrane portion 12a, representing a second relationship between a second displacement of the membrane portion 12b along the second edge versus the applied voltage.

Figure 5:
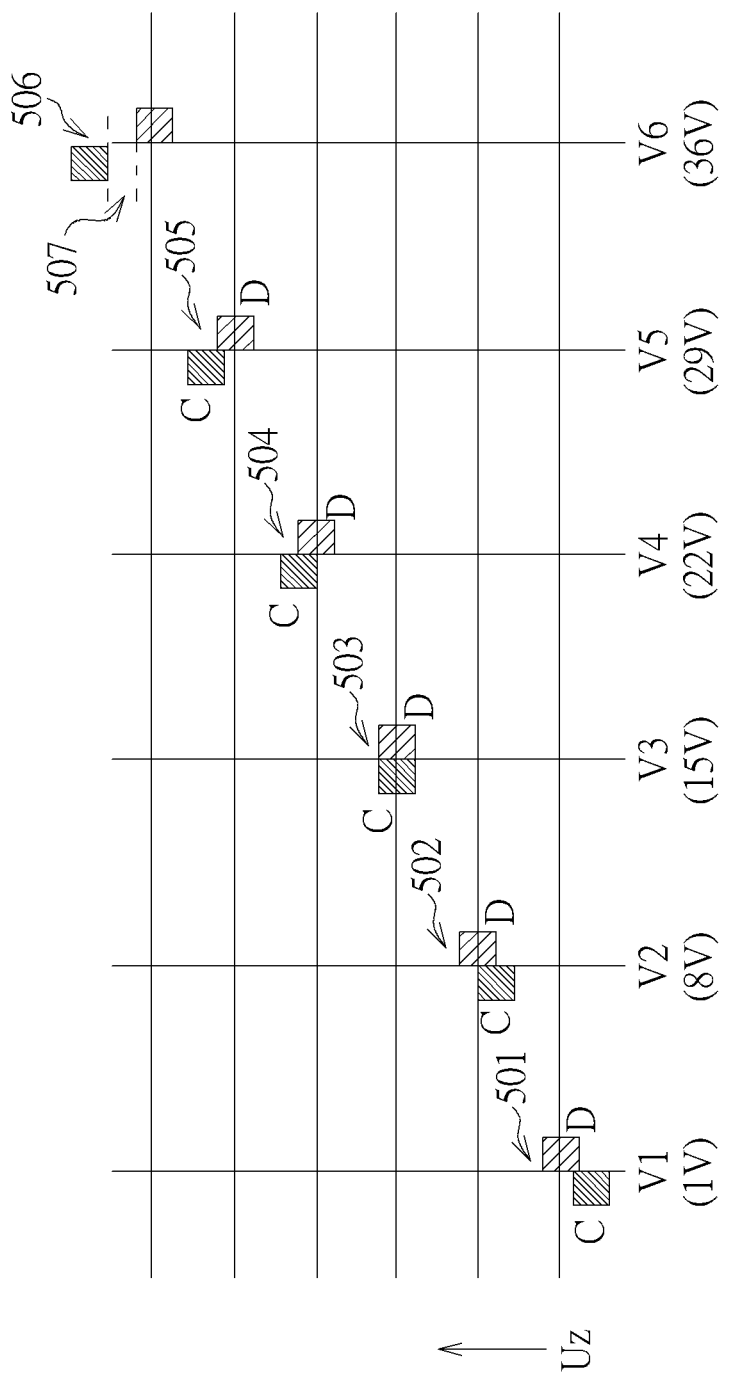
FIG. 5 illustrates multiple samples of relative position pairs on different sides of slit.

In another perspective, FIG. 5 illustrates 6 samples of relative position pairs 501-506 of the point C on the membrane portion 12a and the point D on the membrane portion 12b, corresponding to six progressively higher actuator driving voltage levels V1-V6, as labeled on the horizontal axis of FIG. 5. Vertical axis represents displacements of the membrane portions 12a (at the point C) and 12b (at the point D).

As illustrated in FIG. 5, the point C is significantly below the point D when the voltage V1 (e.g., V1=1V) is applied on the actuator 14. Due to the slope difference of the lines 401 and 402, the membrane portion 12a would be deformed more than the membrane portion 12b, as the driving voltage applied to the actuator 14 rises. When the driving voltage applied to the actuator 14 is up to V6 (e.g., V6=36V), a gap 507 is created, where the gap 110a will be "fully opened". When gap 110a is fully opened, as illustrated in FIG. 3, the volumes on the two sides of membrane 102 transition from being separated to being connected. In other words, an air shunt is formed temporarily between the pressures in the two volumes on the two side of the membrane 102 by the formation of gap 110a (and 110b, 100c, 110d, etc.).

In other words, the membrane portion 12a is partially below the membrane portion 12b when the applied voltage is at the voltage levels V1 or V2. The membrane portion 12a is substantially aligned to the membrane portion 12b when the applied voltage is around the voltage level V3. The membrane portion 12a is partially above the membrane portion 12b when the applied voltage is at the voltage levels V4 or V5. When the applied voltage is V6, greater than a certain voltage level (between V5 and V6), the membrane portion 12a is completely above the membrane portion 12b.

Note that, the numerical values shown in FIG. 5 are for illustrative purpose, practical applied voltage may be adjusted according to practical circumstance.

The slit width should be sufficiently small, e.g., 1 um in practice. The slits 11a-11d form narrow channels over the thickness of the membrane, which may be 5-7 um in practice. Airflow through narrow channels can be highly damped due to viscous forces/resistance along the walls of the airflow pathways, known as boundary layer effect within field of fluid mechanics. In comparison, the gap opening 110a, as illustrated by 507 of FIG. 5, are between the corners/edges of two plates, which represents minimum surface parallel to the direction of the airflow and therefore minimize the viscous force exerted on the airflow. So, when the membrane 12 is below a gap actuating voltage (e.g., when the driving voltage applied on the actuator 14 is the voltages V1-V5) and no gap in Z-direction (e.g., 110a or 507) is formed, the air flows through the slits 11a-11d will be much smaller compared to the airflow through PEO 160 in plate 16, or much smaller than the airflow through the air shunt, which means that the slits 11a-11d may be considered substantially sealed relative to the airflow through PEO 160 in plate 16 during the period of the pulse generation cycle.

In other words, the slit width is sufficiently small such that, the airflow/leakage through the slit when the applied voltage is between V1 and V5 is negligible compared to (e.g., less than 1% of) the airflow through the air shunt when the gap 110a/507 is formed.

In addition, supposed that V1' denotes a minimum voltage level corresponding to which the membrane portion 12a is partially below the membrane portion 12b and V5' denotes a maximum voltage level corresponding to which the membrane portion 12a is partially above the membrane portion 12b. A difference between V1' and V5' may be determined by the thickness of the membrane 12. The difference between V1' and V5' may be larger when the membrane 12 is thicker. In other word, the thickness of the membrane 12 may determine a range of the voltage swing SW during the period of the pulse generation cycle in which the slit is considered/substantially sealed, i.e., the airflow/leakage through the slit is negligible compared to the airflow through the PEO 160 or through the air shunt.

The type of driving force applied on the membrane 12 (produced by the actuator 14) is not limited. For example, the membrane 12 may be driven by piezoelectric force, electrostatic force, electromagnetic force, or electrothermal force, which is not limited thereto. For example, the actuator 14 may be a NED (Nanoscopic Electrostatic Drive) actuator.

Figure 6:
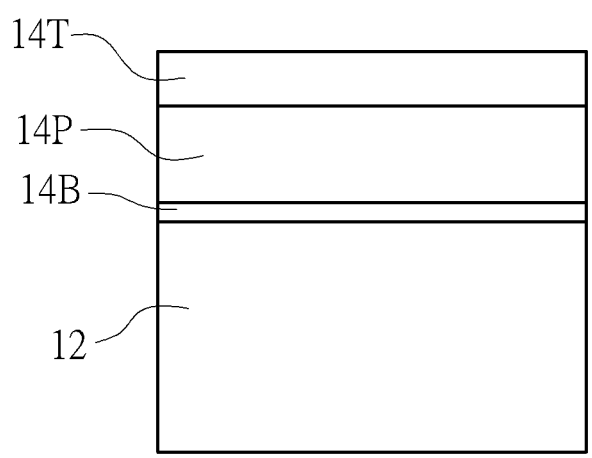
FIG. 6 is a schematic diagram of a sectional view of an actuator according to an embodiment of the present application.

Take piezoelectric actuator as an example, the actuator 14 may comprise a first (top) electrode 14T, an actuating material 14P and a second (bottom) electrode 14B, as FIG. 6 illustrates. The actuating material 14P may comprise PZT (lead zirconate titanate) material (preferably with high $\varepsilon_{31}$). The actuator 14 may receive a SEAM driving signal DS.

Figure 7:
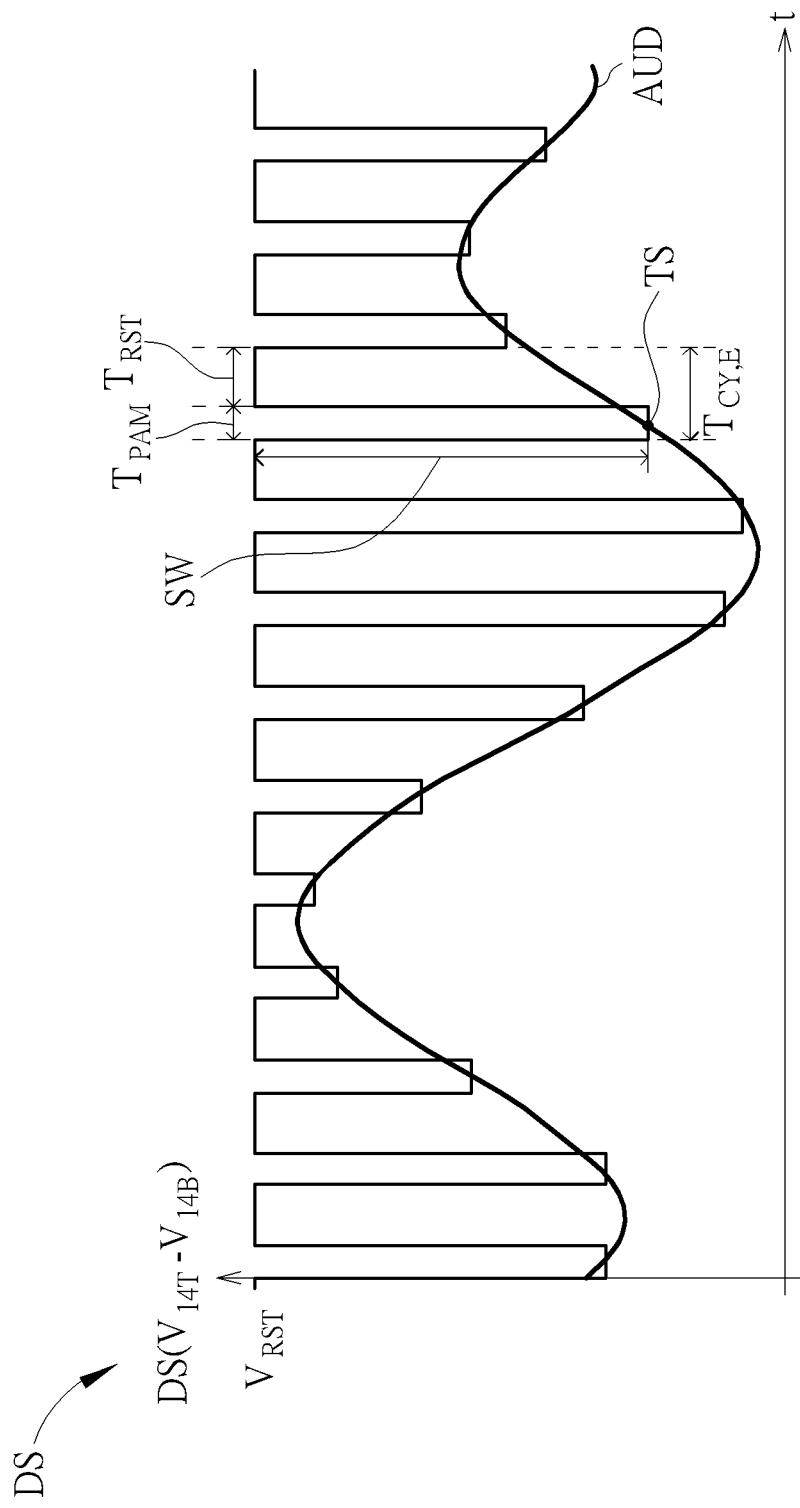
FIG. 7 is a schematic diagram of a driving signal according to an embodiment of the present application.

FIG. 7 illustrates a schematic diagram of a waveform of the driving signal DS corresponding to an input audio signal AUD. The driving signal DS may be applied to the top electrode 14T while a DC bias voltage $V_B$ is applied to the bottom electrode 14B, and voltages $V_{14T}$ and $V_{14B}$ show in FIG. 7 represent voltages on the top electrode 14T and the bottom electrode 14B, respectively. The driving signal DS comprises a plurality of electrical pulses EP. The electrical pulse EP has an electrical pulse cycle $T_{CY,E}$. The electrical pulse cycle $T_{CY,E}$ comprises a PAM (pulse-amplitude modulation) phase, corresponding to time period $T_{PAM}$, and a RST (reset) phase, corresponding to time period $T_{RST}$. In reality, the air pulse cycle $T_{CY,A}$ and the electrical pulse cycle $T_{CY,E}$ would have the same length, or more or less have the same length. Both of them may be abbreviated as the pulse cycle $T_{CY}$. In an embodiment, the voltage $V_{14B}$ may represent a (bias) voltage applied on the bottom electrode (14B).

As the SEAM driving signal, all of the plurality of electrical pulses EP would have the same polarity with respect to a voltage $V_{RST}$, or be unipolar with respect to the voltage $V_{RST}$. In the embodiment illustrated in FIG. 7, the electrical pulses EP are all negative (i.e., have negative polarity) with respect to (or compared to) the voltage $V_{RST}$. That is, except for the transition periods, the voltage level of DS will be below $V_{RST}$ during the PAM phase, and equal to $V_{RST}$ during RST phase.

A voltage swing SW within the PAM phase $T_{PAM}$ may be determined by an instantaneous sample TS of the input audio signal AUD. The driving signal DS swings over the voltage swing SW within the PAM phase $T_{PAM}$ resulting in PAM phase DS voltage levels in the range of V1~V5 of FIG. 5, corresponding to the status where no gaps are formed across the slit openings and therefore the "gap" are considered "non-opened" within the PAM phase $T_{PAM}$.

By driving membrane with proper voltage so that gaps, such as 110a of FIG. 3, are formed temporarily during the RST phase along slits 11a~11d to let the airflow pass through membrane 12 while no such gaps appears during the PAM phase, operations of the slits 11a-11d and their associated temporary gaps 110a~110d, are similar to the open-and-close movement of valves. Note that, no physical/actual valve is constructed and no mechanical contact occurred across the surfaces of slits 11a~11b in the air pulse generating element 10, however, the air pulse generating element 10 retains functionality of valve(s) by utilizing the different slopes of displacement vs. voltage illustrated in FIG. 4, and the interplay between the differential displacement and the thickness of the membrane as illustrated in FIG. 5, to cause gap openings to be formed temporarily during the RST phase (the "opened" state) and disappear during the PAM phase (the "non-opened" state). Thereby, complexity and drawbacks of realizing physical valves, such as stiction, with the MEMS sound producing device is sophisticatedly bypassed.

Due to the presence of valve functionality in the absence of physical valve, the mechanism of the temporarily forming the Z-direction gap opening, such as 110a in FIG. 3, is also referred to as "virtual valve" in the present application. Note that, a critical factor that enables "virtual valve" to exhibit the functionality of "physical valve" is the brevity time of the valve needs to appear to be "non-opened". Despite the width of the slit being 1 μm or less, given long enough time, air will flow through the slit and the pressure in chamber 13 would not be maintained. So, although it is critical to minimize the slit width, in the X-Y plane, it is also crucial to consider the length of time in order to keep the net airflow during the PAM phase under acceptable range. If the length of PAM phase is too long, significant air may flow through slits 11a~11d even without forming gap such as 110a and the pressure within chamber 13 may fall too much and the output SPL may drop significantly. Therefore the pattern, length and width of slits, the durations of PAM phase $T_{PAM}$ and the duration of RST phase $T_{RST}$ need to be addressed as a whole in order to optimize the performance from the "virtual valve" operation discussed above.

Furthermore, referring back to FIG. 1, the air pulse generating element 10 may optionally comprises ridges 102, side walls 106 and a back cover 108. The ridges 102 are disposed on the plate 16. A back chamber 17 is formed between the membrane 12, the sidewalls 106 and the back cover 108. Optionally, a vent hole 109 may be formed within the back cover 108. The vent hole 109 may be a hole or a tube and may form a bass reflex port in similar manner as conventional speaker back enclosure, causing the 180° off phase back radiation to experience additional 180° phase shift at the port resonance and become in-phase with the front radiation, resulting in an increase of SPL at the resonance frequency of the back chamber volume and the optional opening (vent hole 109).

Figure 19:
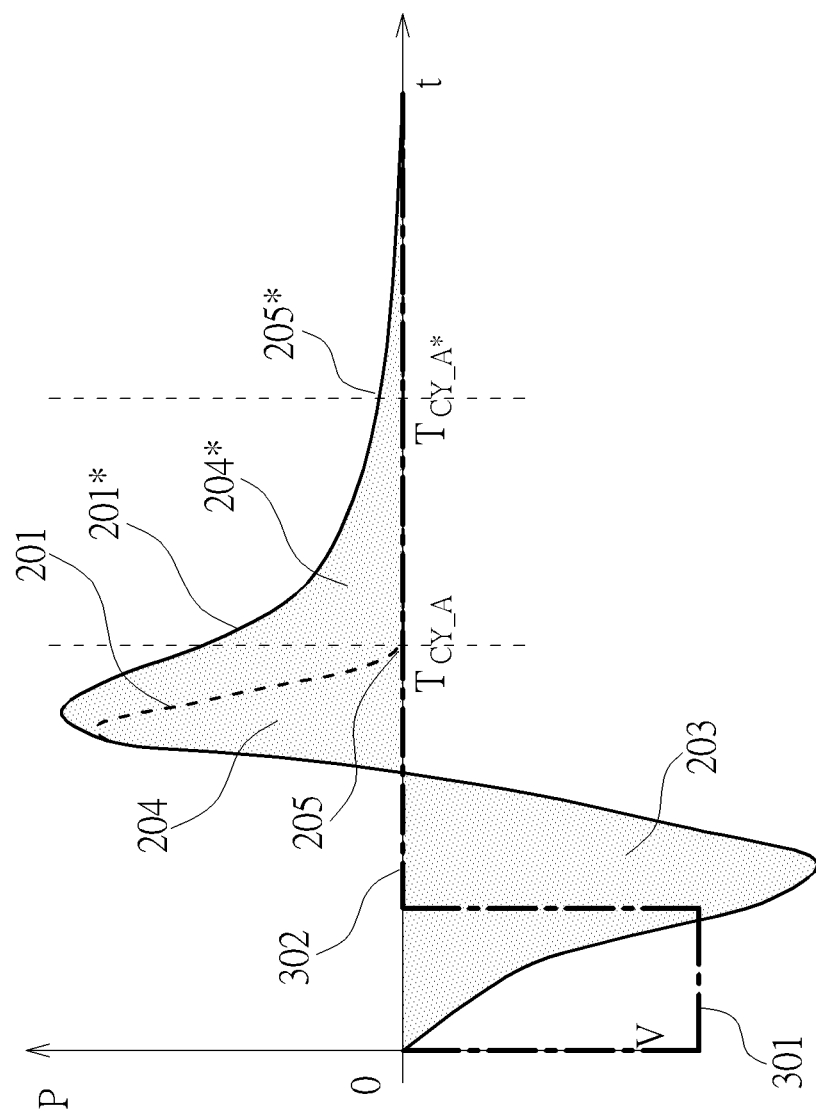
FIG. 19 illustrates pressure profiles of with and without gap opening.

FIG. 19 illustrates curves 201 and 201* representing pressure profiles P versus time t. The vertical axis P is the difference between pressure inside the volume of chamber 13 and the ambient pressure outside of device 10 and 0 means no difference from ambient pressure. Dashed line 301 corresponds to driving signal DS, where the leading edge of dashed rectangle corresponds to the start of PAM phase of one particular pulse cycle. For line 301, vertical axis corresponds to voltage level (DS-$V_{RST}$) and, therefore, 0 corresponds to the voltage level of $V_{RST}$ of FIG. 7. The curve 201* represents pressure profile within the chamber 13 when $V_{RST}$ corresponds to V5 of FIG. 5, i.e. no gap opening during the RST phase. The curve 201 represents pressure profile within the chamber 13 when $V_{RST}$ corresponds to V6 of FIG. 5, i.e. one or more gap opening, such as 110a, is formed during the RST phase. The leading portion of curves 201* and 201 overlap with each other, because DS signal level is the same in both cases, leading to the same membrane behavior during the PAM phase. The trailing portion of the curve 201*, roughly corresponding to the RST phase where DS≈V5, has a long tail because, at DS≈V5, no gap will be formed over membrane 12 and the pressure inside chamber 13, resulting from membrane movement during PAM phase, needs to be neutralized with the ambient above plate 16, mainly by the airflow through the PEO 160. In comparison, the trailing portion of the curve 201, roughly corresponding to RST phase where DS≈V6, has a lower peak pressure, a faster decay time and a smaller final residual, because temporary shunts are formed to connect the volumes on the two sides of membrane 12 with each other through the gaps, such as illustrated by 3D perspective view 110a or 2D cross sectional view 507, and these shunts allow the air to quickly exchange between the two connected volumes and therefore accelerates the speed to achieve pressure balance between the two temporarily connected volumes. Note that, instead of waiting for majority of the airflow through the listener-facing side PEO of device 10 (opening 160 on plate 16) as in the case of curve 201*, majority of the pressure balancing/neutralizing airflow occurs via air exchange between chamber 13 and the volume 17 on the back-facing side of device 10 in the case of curve 201.

Supposed that the air pulse cycle under the case without forming gap opening is $T_{CY,A}$*. A net air pressure $\Delta P_{CY,A}$* produced within the air pulse cycle $T_{CY,A}$*, is evaluated by an integration of the curve 201* over a time interval [0, $T_{CY,A}$*], which is an area encompassed by the curve 201* within the time interval [0, $T_{CY,A}$*], equivalently, a summation of an area 203 and an area 204*. Due to the areas 203 and 204* are comparable, the net air pressure $\Delta P_{CY,A}$* is small, and the resulting SPL would be small.

Another drawback of no gap opening formed is the amount of residual pressure. As can be seen from FIG. 19, a residual pressure 205* is left at an end of the air pulse cycle $T_{CY,A}$*, which would cause inter-pulse interference and degrade sound quality.

The small net air pressure and residual pressure problems can be solved by the forming gap opening during the RST phase by proper membrane design and corresponding driving signal such as illustrated by FIGS. 2, 3 and 5. Supposed that the air pulse cycle, under the case that gap opening(s) is formed during the RST phase, is $T_{CY,A}$. A net air pressure $\Delta P_{CY,A}$ produced within the air pulse cycle $T_{CY,A}$ is a summation of the area 203 and an area 204. Due to the gap opening(s) being formed during the RST phase, the area 204 will be significantly smaller relative to area 204*, and thereby the net air pressure $\Delta P_{CY,A}$ and the SPL would be significantly enhanced.

Furthermore, the residual pressure may be reduced from 205* to 205, which is zero or close to zero. In other words, it can be considered that there is barely or insignificant residual pressure at the end of the air pulse cycle $T_{CY,A}$. Or, at the end of the air pulse cycle $T_{CY,A}$, the chamber air pressure may be almost equal to the ambient air pressure.

Moreover, given the far faster decay of curve 201 relative to curve 201*, the air pulse cycle may be reduced from $T_{CY,A}$* to $T_{CY,A}$, while still reducing the residual pressure from 205* to 205, thereby the increase duty factor from $T_{PG}/T_{CY,A}$* to $T_{PG}/T_{CY,A}$, where $T_{PG}$ represents the pulse-generating time segment, and thus improve the output SPL significantly.

In addition, an efficiency of generating air pressure may be evaluated by a ratio $r=(\Delta P_{CY}/\Delta|P_{CY}|)$. $\Delta P_{CY}$ may be defined as $\Delta P_{CY}=\int P(t)dt$ and $\Delta|P_{CY}|$ may be defined as $\Delta|P_{CY}|=\int|P(t)|dt$, where the integration operation $\int \cdot dt$ is performed over one air pulse cycle. According to finite-element simulations, for the case without gap opening (represented by the curve 201*), the ratio r may be 1~3%, while the case where the gap opening is formed (represented by the curve 201), the ratio r increases to 30~40%, an improvement of roughly 20 times.

In this regard, the air pulse generating element 10 may generate a plurality of net air pulses, and the plurality of net air pulses would have the same polarity relative to the ambient pressure outside the air pulse generating element 10.

In order to optimize membrane displacement, it is desirable for the duration of the driving signal PAM pulse width to be approximately equal to or slightly larger than half the cycle time of membrane resonance frequency. Therefore, the relationship between the driving signal duty factor 1/n, membrane resonant frequency $f_R$, and pulse rate $f_{pulse}$ may be described by equation:

$$\frac{1}{2 \cdot f_R} \approx \frac{1}{n \cdot f_{Pulse}} \text{ or } \frac{f_R}{f_{Pulse}} \approx \frac{n}{2}.$$

Supposed the ratio $$\frac{f_R}{f_{Pulse}}$$

can be expressed as $$\frac{f_R}{f_{Pulse}} = k \cdot n,$$

where k=0.42~0.55. When this condition is satisfied, the membrane can reach the maximum displacement while the duty factor approximate maximum and therefore help maximize the resulting output SPL. In an embodiment of duty factor=1/3, i.e. n=3, the ratio $f_R/f_{pulse}$ shall be within 1.25 to 1.65.

Figure 20:
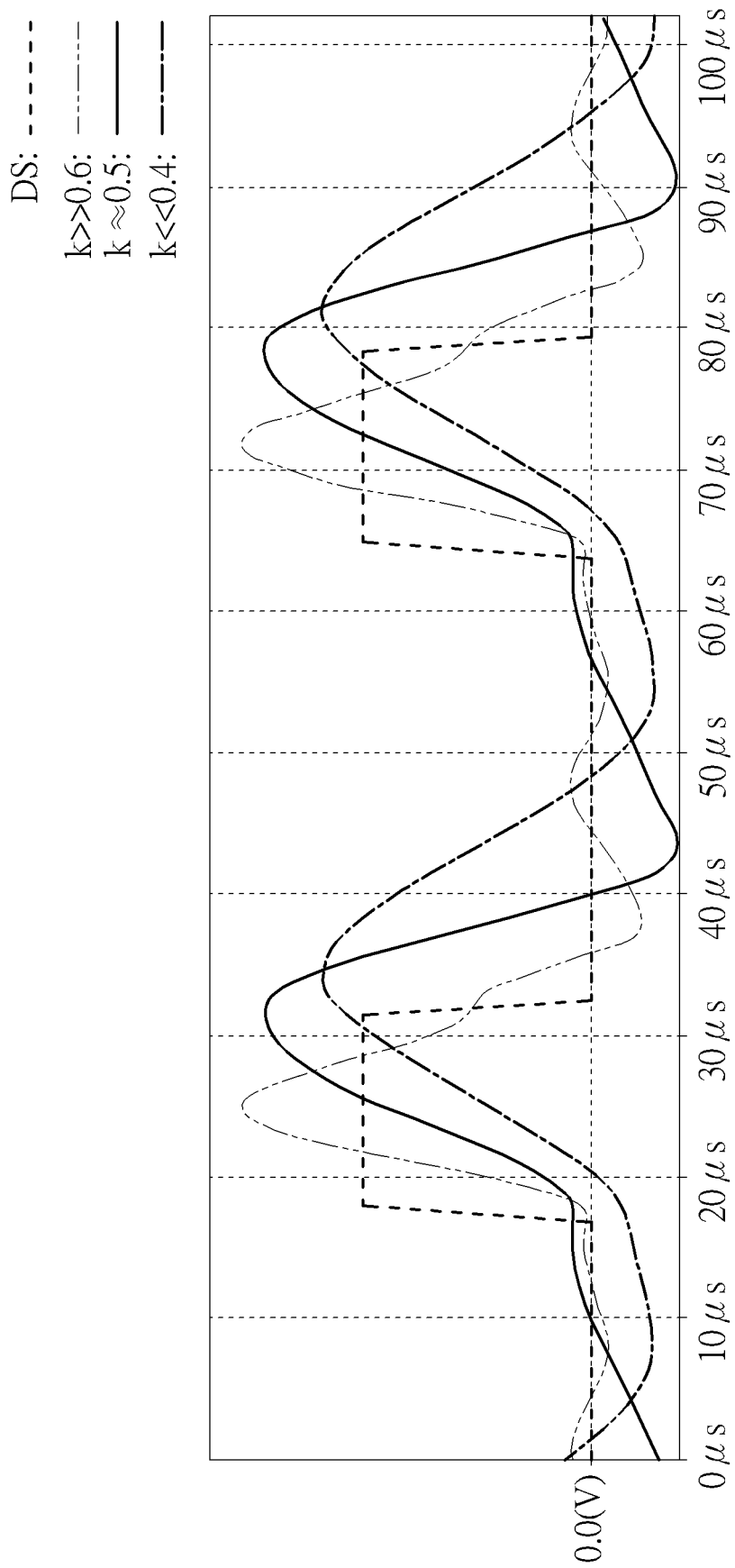
FIG. 20 illustrates waveforms of a driving signal versus membrane displacement.

To elaborate, FIG. 20 illustrates schematic diagram of waveforms of the driving signal DS versus membrane displacements with respect to different k. In FIG. 20, a dot line represents a waveform of the driving signal DS; a dashed-double-dot line, a bold-solid line and a dot-dashed line represent waveforms of membrane displacement with k>>0.6, k≈0.5 and k<<0.4, respectively.

If the ratio ($f_R/f_{pulse}$) is too low, e.g., $f_R/f_{pulse}$<<0.4×n, the membrane 12 would be too slow to react to the driving signal and the membrane 12 may not have reached its steady state (DC) displacement by the end of the PAM phase, let along the overshooting, as the dot-dash line (k<0.4) in FIG. 20 illustrated. On the other hand, if the ratio ($f_R/f_{pulse}$) is too high, e.g., $f_R/f_{pulse}$>>0.6n, the membrane movement would have already passed its overshooting peak and would be in a ringing pattern and may have even fallen below the steady state displacement of membrane 12, as the dashed-double-dot line (k>0.6) in FIG. 20 illustrated. In comparison, when $f_R/f_{pulse}$ 0.5 n, the peaking of the membrane displacement, comprising both the DC displacement and the overshooting, is aligned with the end of the PAM phase, as illustrated by the bold-solid line in FIG. 20, and therefore maximize the pressure generated during the PAM phase.

Figure 8:
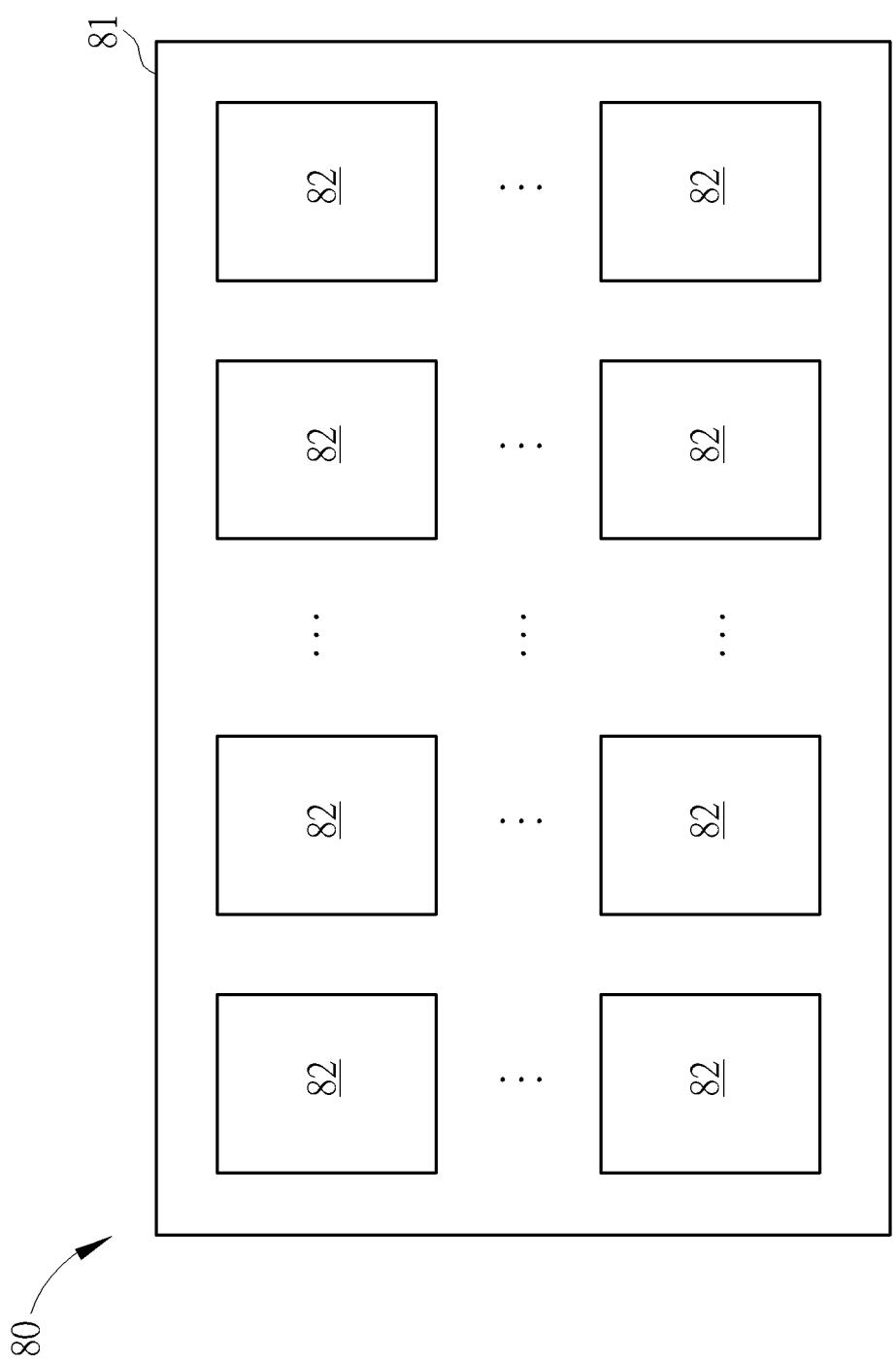
FIG. 8 is a schematic diagram of a sound producing device according to an embodiment of the present application.

FIG. 8 is a schematic diagram of a sound producing device (SPD) 80 according to an embodiment of the present application. The SPD 80 comprises a substrate 81 and a plurality of air pulse generating elements 82. The air pulse generating elements 82 are disposed on the substrate 81. Material of substrate 81 is not limited. The air pulse generating elements 82 may be realized by the air pulse generating element 10, as an example. In fact, the air pulse generating element 82 may be realized by elements comprising membrane with slit(s) such that the gap opening(s) can be temporarily formed, i.e., be realized by elements comprising the "virtual valve" mechanism, which is within the scope of the present application.

Furthermore, the concept of "pulse interleaving", disclosed in U.S. Pat. No. 10,536,770 may be exploited to achieve a higher overall pulse rate. When the "pulse interleaving" is operated at an overall pulse rate PR (in terms of pulses per second), the plurality of air pulse generating elements can be subdivided into several groups (e.g., N groups), each group of air pulse generating elements may generate air pulses at a pulse rate PR/N, and air pulses generated by different groups of air pulse generating elements are spatially-and-temporarily interleaved. Details of the "pulse interleaving" concept/mechanism may be referred to No. 10,536,770, which would not be narrated herein for brevity.

Note that, as can be seen from FIG. 4 and FIG. 5, actuating the membrane such that the gap opening is formed over the slit lines during every pulse cycle $T_{CY}$ would require high voltage swing between the electrodes 14T and 14B. With the capacitance existing between the electrodes within the actuator (e.g., between the electrodes 14T and 14B), the amount of charge required to charge and discharge the actuator electrodes of the air pulse generating element 82 would be high.

On top of the large amount of charge required, the fast rising and fast falling PAM driving waveform exacerbate the situation, causing sharp spikes of switching currents during transitions between PAM and RST phases. Strong EMI (Electro Magnetic Interference) would be induced. Moreover, since the sheet resistance of the bottom electrode has significant resistance (e.g., the typical sheet resistance of the bottom electrode of PZT may be 0.5Ω/□ in practice, where □ denotes a symbol representing "square"), the high current would easily induce significant voltage drop, causing the driving voltage to be dissipated along the signal passage and would have decayed badly before reaching the electrode of the piezo actuator layer 14P. As an illustration, consider a bottom electrode wiring trace consists of a conductor of a 1:2 rectangle, or 2 squares lengthwise, which will have a trace resistance of 2×0.5Ω/□=1Ω. When a switching pulse current of 30 A flows through this conductor, the voltage drop would be 30V. Although this will not actually occur because the driving voltage itself is only roughly 30V, but it is clear that the rising and falling edge will be dramatically slowed down and the driving waveform as seen by the piezoelectric material layer 14P would have deteriorated badly. This example shows the importance to minimize the bottom electrode wiring trace resistance in order to minimize voltage drop due to the high sheet resistance metal layer typically used as the bottom electrode in the piezoelectric actuator.

In order to overcome the above issues, a novel interleaving and cell arrangement methodology (as well as driving circuit) is proposed in the present application, where the air pulse generating elements, such as the 82's of FIG. 8, are subdivided into N spatially interleaved subsets, and these N subsets of elements are driven by N sets of temporarily interleaved driving waveform of 1/N duty factor, such that the current from the bottom electrodes of one subset of elements travels to a neighboring subset of elements directly, without needing to leave the device 80 from a pad, and reenter device 80 from another pad.

In the following description, the term air pulse generating element and air pulse generating cell will be used interchangeably.

Figure 9:
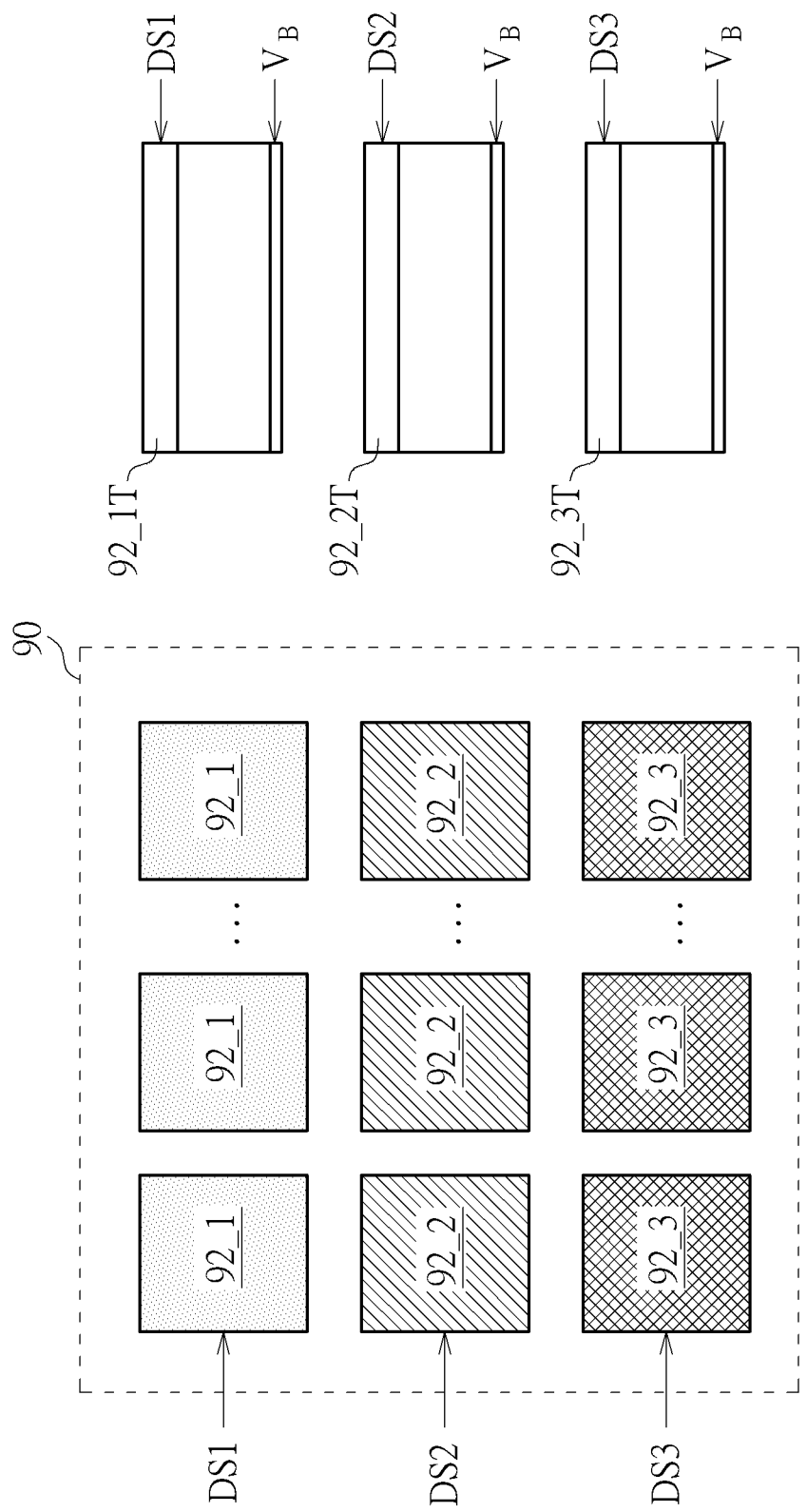
FIG. 9 is a schematic diagram of a sound producing device according to an embodiment of the present application.

FIG. 9 illustrates a schematic diagram of an SPD 90 according to an embodiment of the present application. The SPD 90 comprises air pulse generating elements 92_1-92_3. As shown in the left portion of FIG. 9, the air pulse generating elements 92_1, 92_2, 92_3 are arranged in a 3×M array, where the elements 92_1 occupy the 1$^{st}$ rows of the array, the elements 92_2 occupy the 2$^{nd}$ row, the elements 92_3 occupy the 3$^{rd}$ row, and M herein denotes a number of elements within each row. The SPD 90 may comprise a substrate (not shown in FIG. 9 for brevity) on which the air pulse generating elements 92_1-92_3 is disposed. One/each of the air pulse generating elements 92_1-92_3 may comprise an actuator with a first electrode (e.g., top electrode) and a second electrode (e.g., bottom electrode). The actuator within each of the (air pulse generating) elements 92_1-92_3 may have similar or same cross sectional structure of the actuator 14 illustrated in FIG. 6. In an embodiment, the bottom electrodes of the air pulse generating elements 92_1-92_3 may be electrically connected via the common metal layer, such as Platinum (Pt) alloy, which makes up the common bottom electrode 14b.

Construct of the air pulse generating elements 92_1-92_3 is not limited. The air pulse generating elements 92_1-92_3 may be realized by the air pulse generating element 10 illustrated in FIG. 1, or other kind of (piezo actuated) air pulse generating element, which may be able to generate a plurality of air pulses, where the plurality of air pulses may produce a non-zero offset and be aperiodic over a plurality of pulse cycles. In an embodiment, gaps may be also temporarily formed on the membranes within the air pulse generating elements 92_1-92_3 during the RST phase.

In addition, actuators within the air pulse generating elements 92_1-92_3 may have same/similar structure as the actuator 14, which are reproduced in the right portion of FIG. 9, in a cross sectional perspective. Top electrodes of the M air pulse generating elements 92_1 are connected together to form one driving electrode 92_1T. Likewise for 92_2T and 92_3T. For sake of convenience, in the right portion of FIG. 9, top electrodes of the elements 92_1, 92_2, 92_3 are denoted as 92_1T, 92_2T, 92_3T, respectively.

Electrodes 92_1T-92_3T are driven by driving signals DS1-DS3, respectively. That is, the electrodes 92_1T-92_3T receives the driving signals DS1-DS3, respectively. The driving signals DS1-DS3 may be temporally interleaved SEAM driving signal. That is, all of the electrical pulses within the driving signals DS1-DS3 have the same polarity with respect to a certain voltage, e.g., $V_{RST}$. In addition, electrical pulses EP_1 within the driving signal DS1, electrical pulses EP_2 within the driving signal DS2 and electrical pulses EP_3 within the driving signal DS3 are temporally and mutually interleaved, which means that, ignoring the transition time/edge of the electrical pulse, signal portions of the pulses EP_1, EP_2, EP_3 (out of the voltage $V_{RST}$) would not mutually overlap temporally. In other words, without considering the pulse transition time/ edge of the electrical pulses, PAM phases of the driving signal DS1, PAM phases of the driving signal DS2 and PAM phases of the driving signal DS3 would not overlap one another. In signal waveform aspect, the portion of the pulses EP_1 out of the voltage $V_{RST}$ would neither overlap with the portion of the pulse EP_2 out of the voltage $V_{RST}$ temporally, nor with the portion of the pulse EP_3 out of the voltage $V_{RST}$ temporally, and vice versa.

Generally speaking, the pulse generating elements/cells 92_1-92_3 of device 90 may be (spatially) subdivided into n subdivisions/groups, where n=3 in the example shown in FIG. 9. The bottom electrodes of all pulse generating elements of device 90 may be connected together and wired to a DC bias voltage source to receive the voltage $V_B$ via the metal layer used to construct the bottom electrode of the actuator, such as 14B in FIG. 6. Cells within each of the n subdivisions/groups may be arranged as a cell-rows (or simply a row), where n=3 and m≥4 in FIG. 9, and cell-row means a row of cells. The cell-rows are disposed by and placed parallel to each other, in order to maximize the contact area between cell-rows and therefore minimize the square count of bottom electrodes between cell-rows.

The driving signals DS1-DS3 may be SEAM waveform having duty factor of 1/n, where n may be an integer. In the embodiment shown in FIG. 9, n=3. The timing between driving signals DS1-DS3 is to be arranged, such that the trailing edge of DS1's PAM phase aligns with the leading edge of DS2's PAM phase, the trailing edge of DS2's PAM phase aligns with the leading edge of DS3's PAM phase, and the trailing edge of DS3's PAM phase aligns with the leading edge of DS1's PAM phase. In this arrangement, at the transition from the PAM phase of DS1 to the PAM phase of DS2, the voltage signal swing applied to electrode 92_1T and 92_2T will be time aligned but polarity inverted and the current flow of top electrode 92_1T will be the opposite of the current flow of top electrode 92_2T.

By arranging cell-rows 92_1, 92_2 and 92_3 in spatially interleaved manner as illustrated in FIG. 9, the broad interface between cell-rows helps lowers the inter cell-row bottom metal layer square-count significantly and therefore reduces the inter cell-row resistance between the bottom electrodes of 92_1, 92_2 and 92_3. When a pair of opposite current flows occur between top electrodes 92_1T and 92_2T during the transition from the PAM phase of DS2 to the PAM phase of DS3, the corresponding current flows at the bottom electrodes of cell-rows 92_1 and 92_2 will flow toward each other via the broad interface between these cell-rows 92_1 and 92_2 along paths of the least resistance. Due to the minimum distance traveled by these current pulses, both the voltage drop (I·R) and the power consumed (I$^2$·R) will be minimized, which lead to both higher fidelity of driving signals DS1~DS3 on electrodes 92_1T-92_3T and lower power consumption (and heat generation) on the metal layer of the bottom electrode.

Similar discussion applies to the transitions between the PAM phases of DS2 and DS3 and between the PAM phases of DS3 and DS1.

From the perspective at the chip level, by time-align the transition edges among PAM phases between 92_1T-92_3T, the bottom electrode current pulses caused by these PAM phase transitions will largely neutralize one another, within the metal layer forming the bottom electrodes, leading to greatly reduced net current flow on the chip-level $V_B$ electrode, which is the pad connecting the metal layer of the bottom electrodes to the outside. In summary, from the perspective chip-90, the current flow caused by SEAM switching waveform self-annihilates one another between neighboring cell-rows, within the bottom electrode metal layer of device 90, and the net current flow for the device 90 chip-level bottom electrode will be largely independent of the individual SEAM pulse switching waveform applied to top electrodes 92_1T-92_3T. Instead, the current flow in and out of chip-level $V_B$ electrode would be determined mainly by the envelope of the 3 interleaved SEAM driving signals DS1~DS3, i.e., the input audio signal AUD (see FIG. 1). Thereby, power consumption would be significantly reduced.

Figure 10:
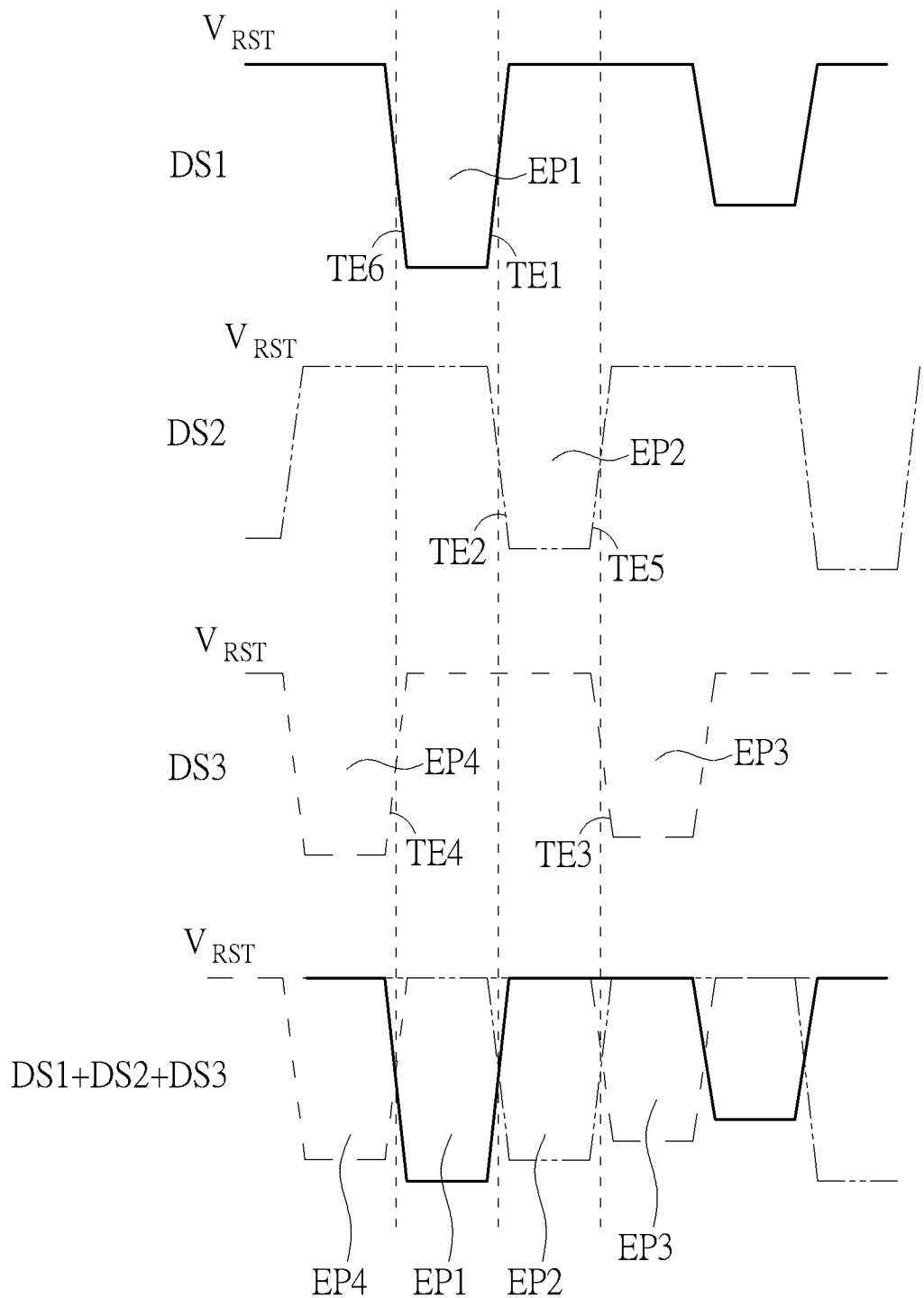
FIG. 10 is a schematic diagram of a plurality of driving signals according to an embodiment of the present application.

From the signal waveform aspect, FIG. 10 illustrates the driving signals DS1-DS3, where the plot in the bottom of FIG. 10 illustrates a superposition of the driving signals DS1-DS3, and the rest plots in FIG. 10 illustrates the driving signals DS1-DS3 individually. As FIG. 10 shows, the driving signal DS1 comprises an electrical pulse EP1, the driving signal DS2 comprises an electrical pulse EP2, and the driving signal DS3 comprises electrical pulses EP3 and EP4. The pulse EP1-EP4 are all negative (or have negative polarity) with respect to the voltage $V_{RST}$.

The electrical pulse EP1 has a leading/falling transition edge TE6 and a trailing/rising transition edge TE1. The electrical pulse EP2 has a leading/falling transition edge TE2 and a trailing/rising transition edge TE5. The electrical pulse EP3 has a leading/falling transition edge TE3. The electrical pulse EP4 has a trailing/rising transition edge TE4.

As shown in FIG. 10, the transition edge TE1 coincides with the transition edge TE2 temporally, and the transition polarities of the transition edges TE1 and TE2 are opposite to each other. In addition, during the coincident transition of the transition edge TE1 and the transition edge TE2, the switching pulse current would flow between the bottom electrodes of the air pulse generating elements 92_1-92_2 via the common metal layer.

Figure 11:
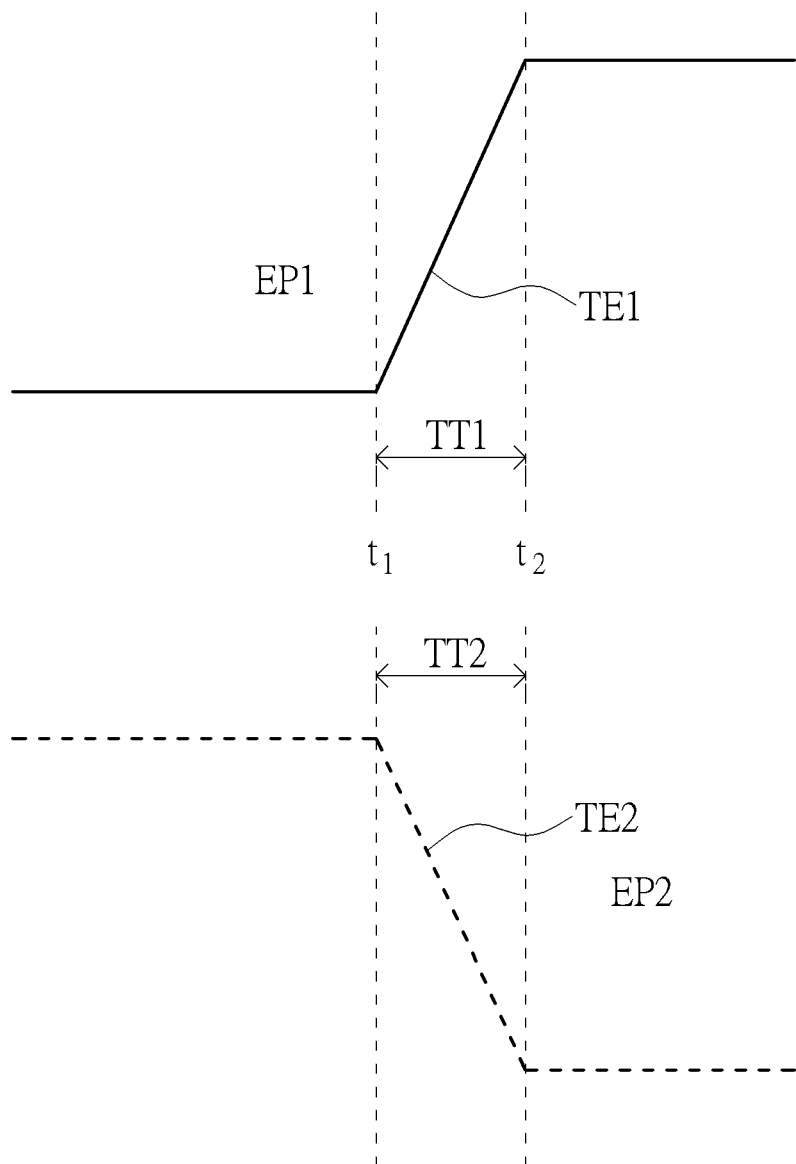
FIG. 11 is a schematic diagram of electrical pulses according to an embodiment of the present application.

For the sake of clarity, the transition edges TE1~TE6 are widened and illustrated in FIG. 11, where the transition edge TE1 is corresponding a transition period/time TT1 and the transition edge TE2 is corresponding a transition period/time TT2, and so on. In an embodiment, the transition period/time corresponding to the transition edge TE1 and the transition period/time corresponding to the transition edge TE2 may partially, or completely, overlap with each other, which means that there exist a certain time te such that the time te is within both the transition time TT1 and the transition time TT2. Preferably, the transition time TT1 and the transition time TT2 is completely overlapped. It means that, the time at which the transition edge TE1 starts rising coincides with the time at which the transition edge TE2 start falling (denoted as $t_1$ in FIG. 11), and the time at which the transition edge TE1 stop rising coincides with the time at which the transition edge TE2 stop falling (denoted as $t_2$ in FIG. 11). In the present application, either "the transition edges TE1 and TE2 being partially overlapped" or "the transition edges TE1 and TE2 being completely overlapped" is referred to the transition edges TE1 and TE2 coinciding with each other.

Similarly, referring back to FIG. 10, the transition edge TE3 coincides with the transition edge TE5 temporally, and the transition edge TE4 coincides with the transition edge TE6.

Rationale of exploiting coinciding transition edges with opposite transition polarities is iterated below. Take the transition times TT1 and TT2 in FIG. 11 as example, within the transition time TT1, it can be regarded that a current would flow into the top electrode, through the actuating material and to the bottom electrode of the (air pulse generating) element 92_1; within the transition time TT2, it can be regarded that a current would flow from the bottom electrode, through the actuating material and out of the top electrode of the (air pulse generating) element 92_2. Given the fact that the transition times TT1 and TT2 coincide with other (and the bottom electrodes of the air pulse generating elements 92_1, 92_2 are electrically connected), it can be regarded that a switching current, the current produced due to pulse transition, flows into the top electrode of the element 92_1, through the actuating material of the element 92_1 and to bottom electrodes of elements 92_1, 92_2, and flows through the actuating material of the element 92_2 and out of the top electrode of the air pulse generating element 92_2. Note that, during the transition time TT1/TT2, the switching current flows directly between elements 92_1 and 92_2 and would not flow to external path. Therefore, power consumption and unnecessary voltage drop (due to resistance of the bottom electrode material) are significantly reduced.

Note that, the SPD 90 comprises three arrays of air pulse generating elements in FIG. 9, which is not limited thereto. As long as 1) the SPD comprises a plurality of (more than one) air pulse generating elements; and 2) two driving electrical pulses for two different air pulse generating elements have transition edges coinciding with each other and opposite transition polarities, the requirements of the present application is satisfied, which would be within the scope of the instant application. In other words, the two driving electrical pulses in item 2 stated in the above are consecutive to each other. Preferably, the two air pulse generating elements (air pulse generating element) neighbor each other, or a distance between the two air pulse generating elements is less than a length/width of the air pulse generating element itself.

Figure 12:
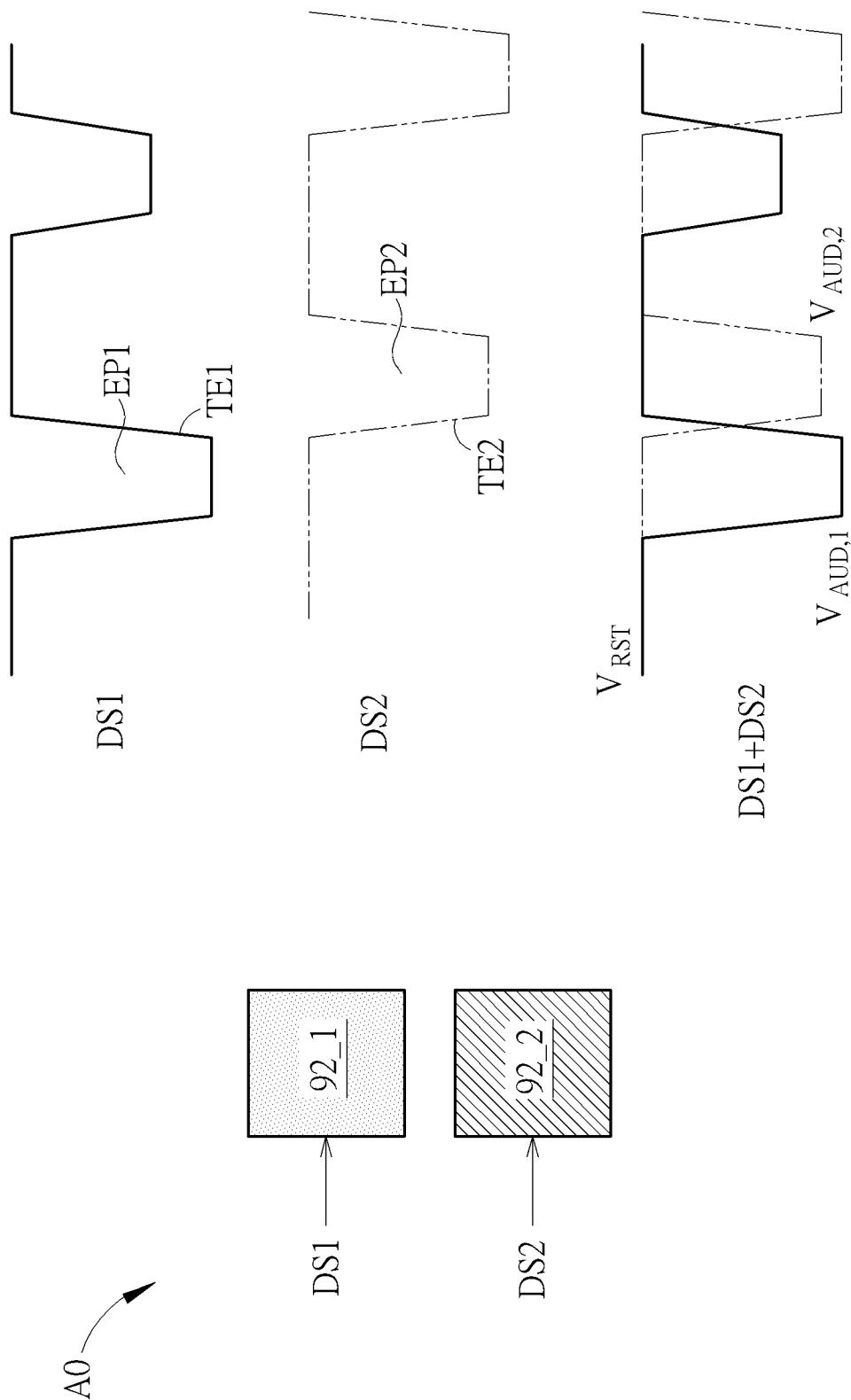
FIG. 12 is a schematic diagram of a sound producing device according to an embodiment of the present application.

In this regard, the SPD of the present application may comprise only two air pulse generating elements, as illustrated in FIG. 12. An SPD A0 is illustrated in a left portion of FIG. 12. The SPD A0 is similar to the SPD 90. Different from the SPD 90, the SPD A0 comprises only two air pulse generating elements 92_1-92_2, driven by the driving signals DS1-DS2. Waveforms of the driving signals DS1-DS2 are illustrated in a right portion of FIG. 12. As shown in FIG. 12 (similar to FIG. 10), the transition edges TE1 and TE2 coincide with each other and the transition polarities thereof (of the transition edges TE1 and TE2) are opposite to each other.

Figure 13:
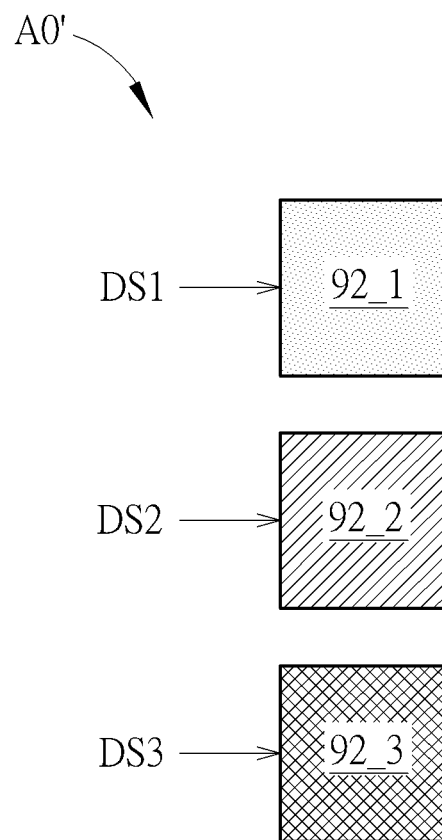
FIG. 13 is a schematic diagram of a sound producing device according to an embodiment of the present application.

Similarly, FIG. 13 illustrates a schematic diagram of an SPD A0' according to an embodiment of the present application. Different from the SPD A0 comprising two air pulse generating elements (92_1-92_2), the SPD A0' comprises three air pulse generating elements 92_1-92_3, driven by the driving signal DS1-DS3, respectively.

Figure 14:
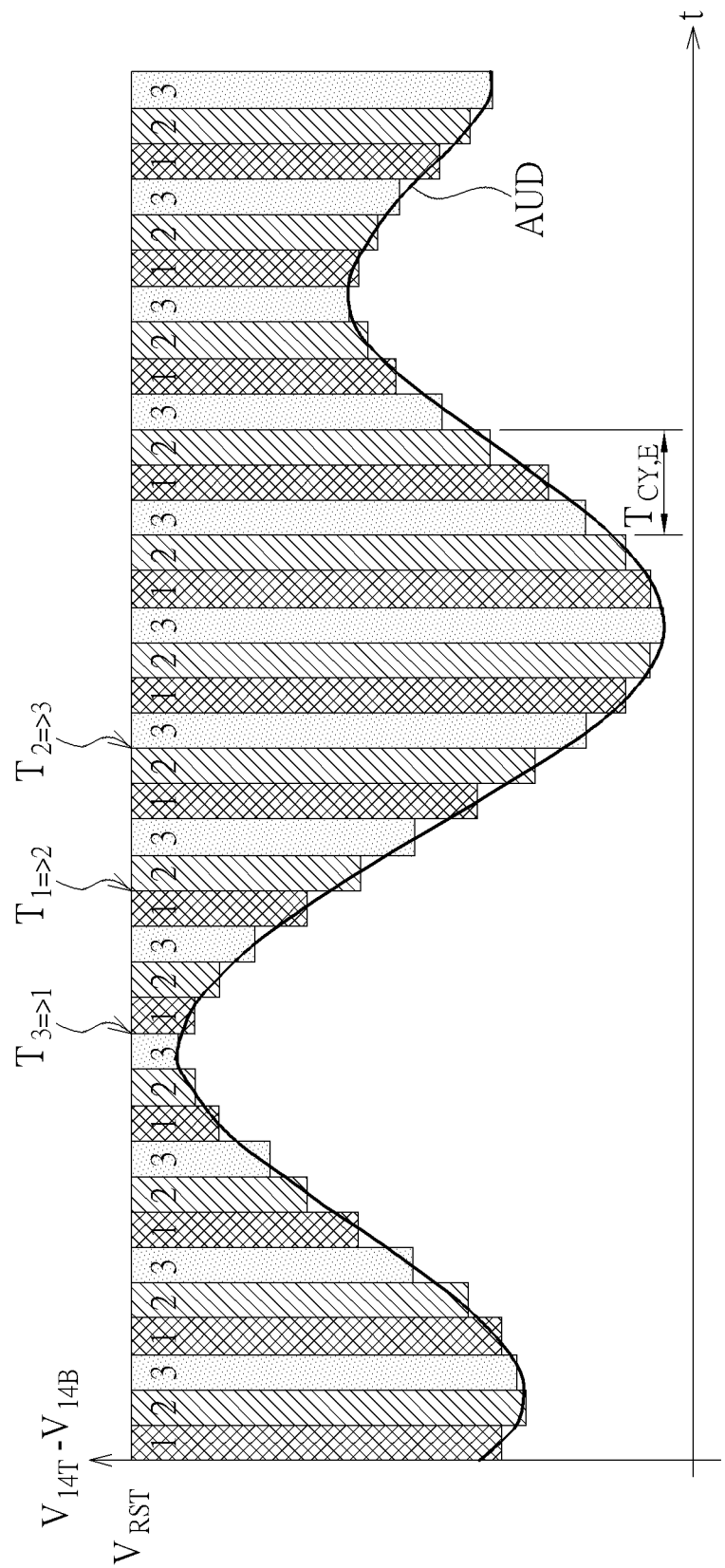
FIG. 14 is a schematic diagram of a plurality of driving signals according to an embodiment of the present application.

FIGS. 10-12 illustrate a microscopic view of the waveforms of the driving signals DS1-DS3, demonstrating the transition edges thereof. In another perspective, for the SPD 90, FIG. 14 illustrates a macroscopic view of waveforms of the driving signals DS1-DS3. In an embodiment, the labels "1", "2" and "3" in FIG. 14 may represent the electrical pulses EP_1 within the driving signal DS1, the electrical pulses EP_2 within the driving signal DS2, and the electrical pulses EP_3 within the driving signal DS3, respectively.

As can be seen from FIG. 14, the driving signals DS1, DS2, DS3 are all SEAM signals, which means that the electrical pulses EP_1, EP_2, EP_3 (within the driving signals DS1, DS2, DS3, respectively) have the same polarity (e.g. negative in the embodiment FIG. 13) with respect to the voltage $V_{RST}$, and are amplitude modulated according to the input audio signal AUD. Further, the driving signals DS1, DS2, DS3 are mutually interleaved, with the rising/trailing transition edges of the electrical pulses EP_3 coincide with the falling/leading transition edges of the electrical pulses EP_1 at a time denoted as $T_{3=>1}$, the rising/trailing transition edges of the electrical pulses EP 1 coincide with the falling/leading transition edges of the electrical pulses EP_2 at a time denoted as $T_{1=>2}$, and the rising/trailing transition edges of the electrical pulses EP_2 coincide with the falling/leading transition edges of the electrical pulses EP_3 at a time denoted as $T_{2=>3}$.

Figure 15:
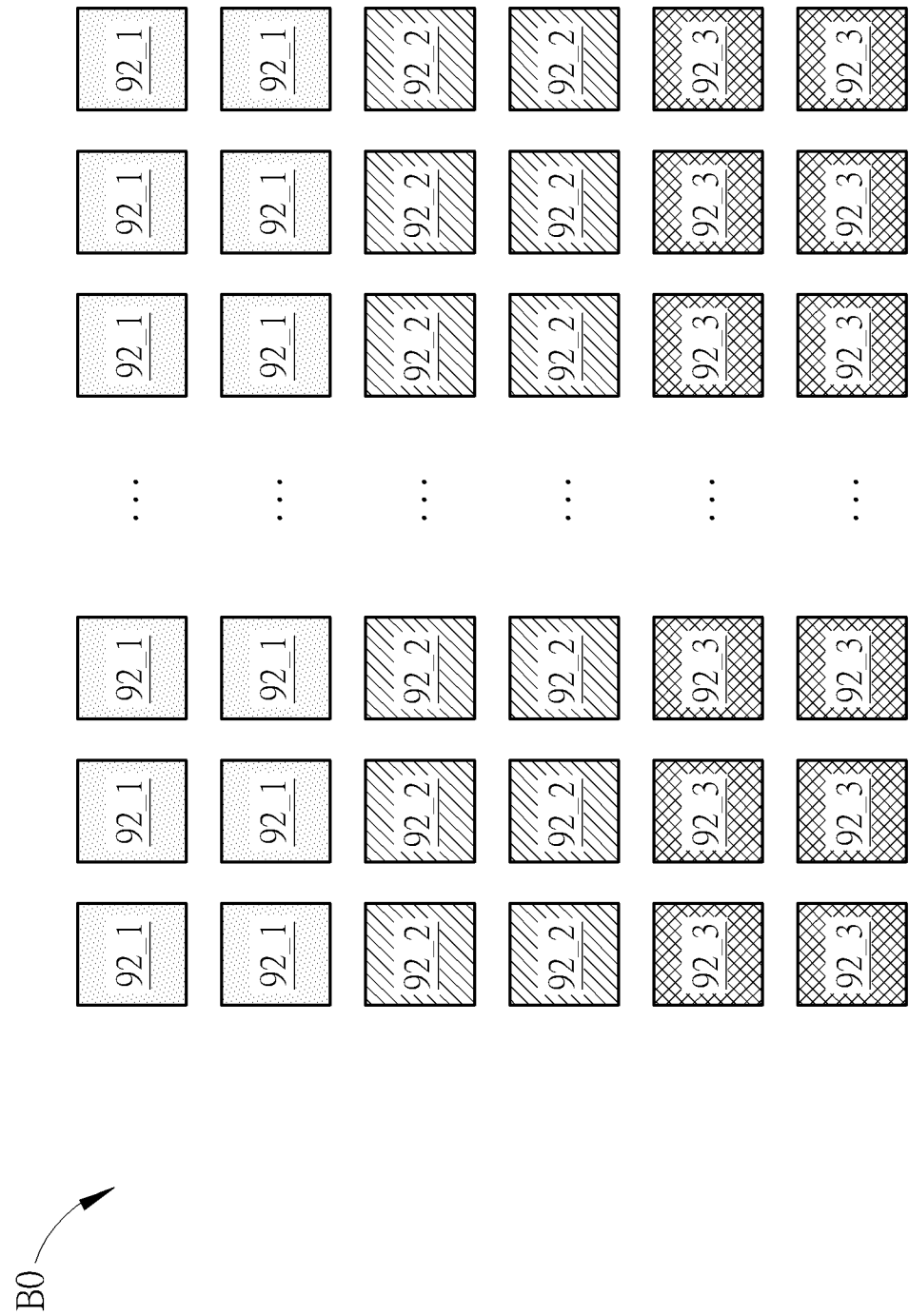
FIG. 15 is a schematic diagram of a sound producing device according to an embodiment of the present application.

In FIG. 9, one driving signal drives one cell-row of air pulse generating elements, which is not limited thereto. In the present application, one driving signal may drive multiple cell-rows of air pulse generating elements. For example, FIG. 15 is a schematic diagram of an SPD B0 according to an embodiment of the present application. In FIG. 15, the elements 92_1 arranged as the $1^{st}$ and the $2^{nd}$ Rows are Driven by the Driving Signal DS1, the Elements 92_2 arranged as the $3^{rd}$ and the $4^{th}$ rows are driven by the driving signal DS2, and the elements 92_3 arranged as the $5^{th}$ and the $6^{th}$ rows are driven by the driving signals DS3.

Note that, in FIG. 15, a distance between the element 92_1 and the element 92_3 is longer than a distance between the element 92_1 and the element 92_2 and/or a distance between the element 92_2 and the element 92_3. Longer distance brings higher resistance. In other words, at the transition time $T_{3=>1}$, the current flowing between the bottom electrodes of the elements 92_1 and the bottom electrodes of the elements 92_3 would result in more voltage drop, compared to the one (voltage drop) caused at the transition time $T_{1=>2}$ by the current between (bottom electrodes of) the elements 92_1 and 92_2, or the one caused at the transition time $T_{2=>3}$ by the current between the elements 92_2 and 92_3.

Figure 16:
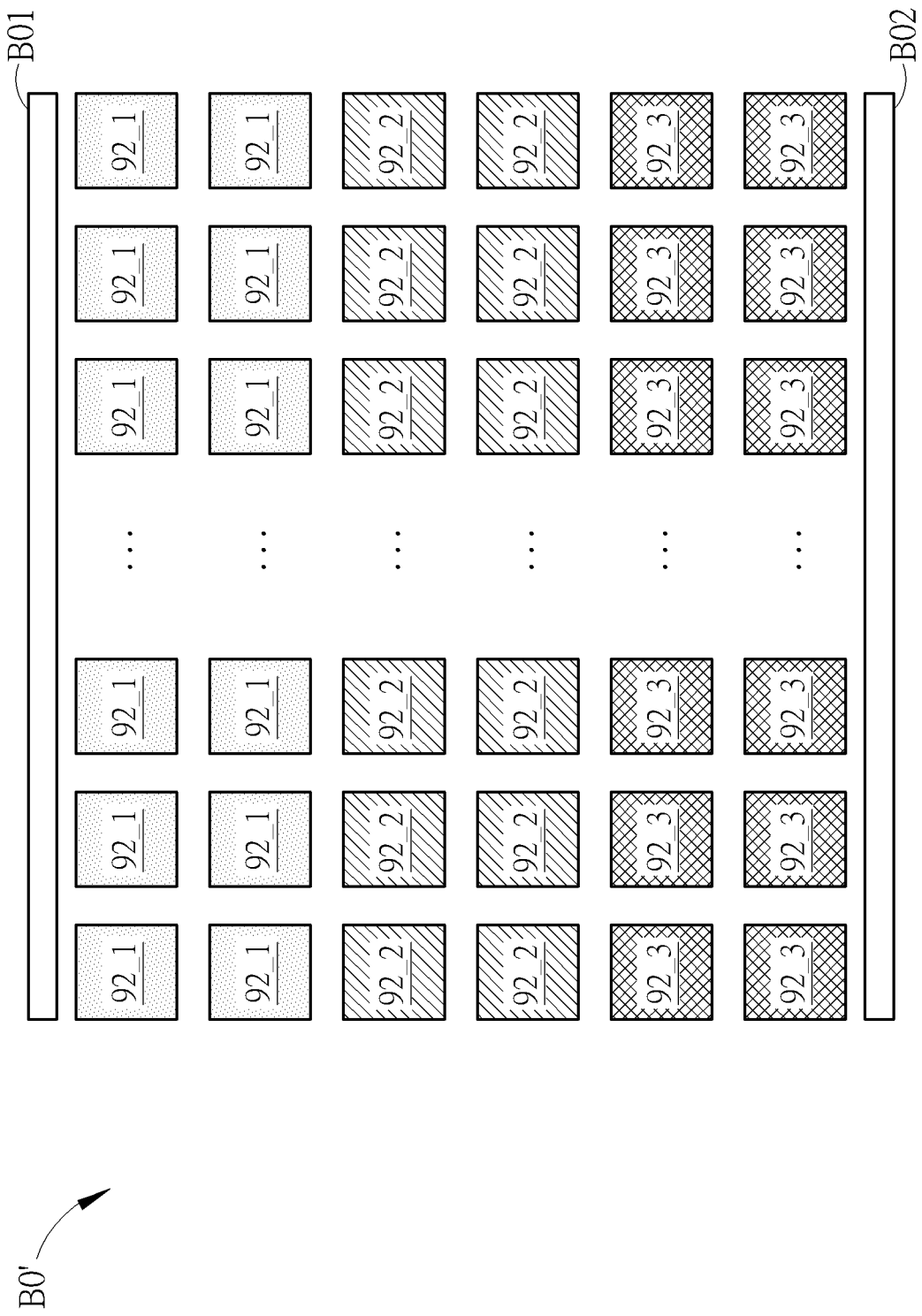
FIG. 16 is a schematic diagram of a sound producing device according to an embodiment of the present application.

To alleviate the extra resistance (or voltage drop) between the elements 92_1 and 92_3 brought by long distance between non-adjacent cells/elements, conducting lines may be included. FIG. 16 is a schematic diagram of an SPD B0' according to an embodiment of the present application. The SPD B0' further comprises conducting lines B01 and B02. The conducting lines B01 and B02 may be made of conductive material (e.g., metal). The conducting line B01 is disposed by/above the $1^{st}$ row of the array and electrically connected to bottom electrodes of the $1^{st}$ row of the air pulse generating elements 92_1; the conducting line B02 is disposed by/below the $6^{th}$ row of the array and electrically connected to bottom electrodes of the $6^{th}$ row of the air pulse generating elements 92_3. The conducting lines B01 and B02 may receive the voltage $V_B$. Thus, in the SPD B0' shown in FIG. 16, the resistance between the elements 92_1 and 92_3 would be close to the one (i.e., resistance) between the elements 92_1 and 92_2 or the one between the elements 92_2 and 92_3.

Figure 17:
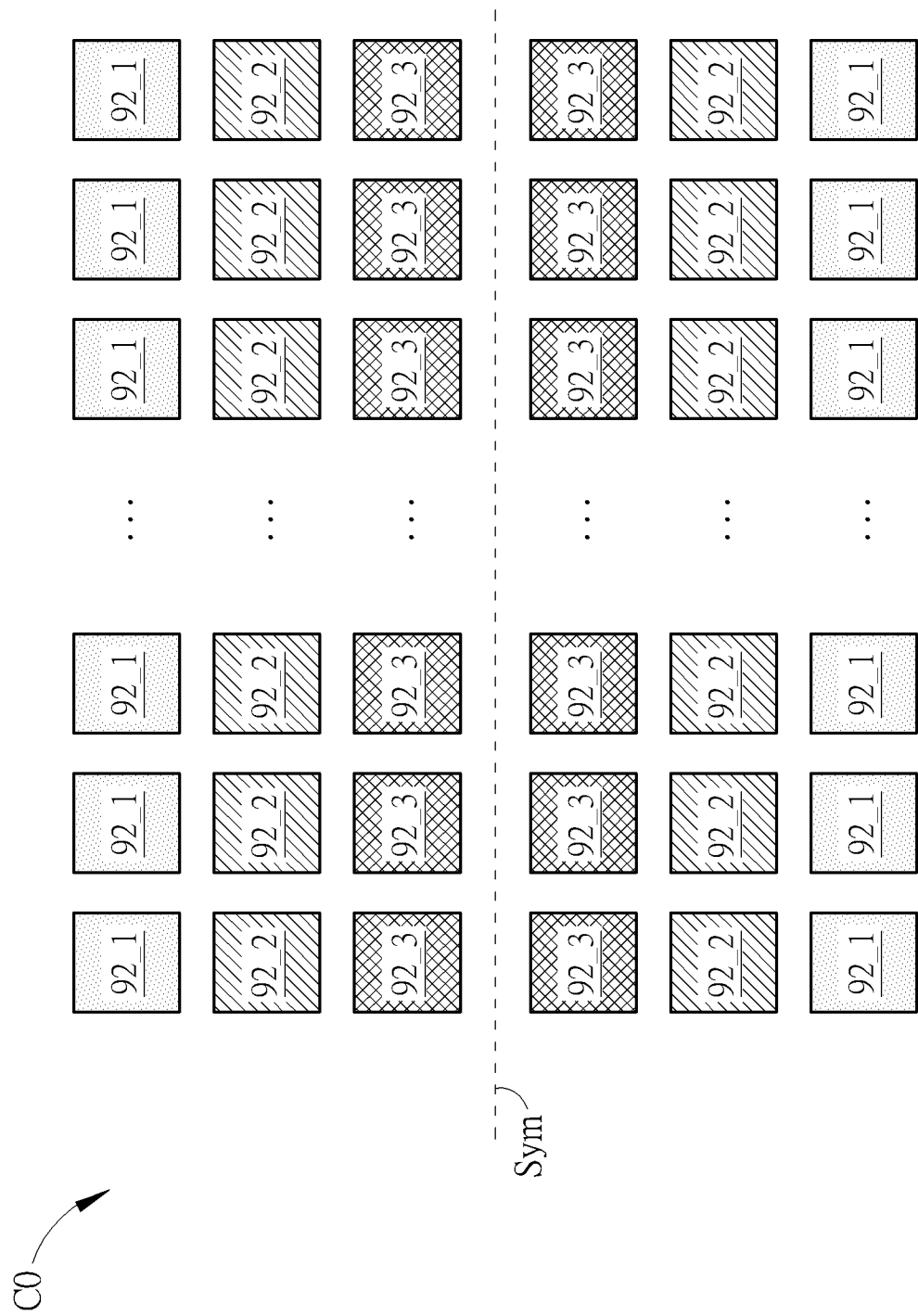
FIG. 17 is a schematic diagram of a sound producing device according to an embodiment of the present application.

Arrangement of the elements 92_1, 92_2 and 92_3 is not limited. For example, FIG. 17 is a schematic diagram of an SPD C0 according to an embodiment of the present application. Different from the SPD B0, the arrangement of the elements 92_1, 92_2 and 92_3 within the SPD C0 are arranged symmetrically, with respect to a symmetry axis Sym. The elements 92_1 may be arranged in the $1^4$ row and the $6^{th}$ row of the array, the elements 92_2 may be arranged in the $2^{nd}$ row and the $5^{th}$ row of the array, and the elements 92_3 may be arranged in the $3^{rd}$ row and the $4^{th}$ row of the array, where the symmetry axis Sym lies between the $3^{rd}$ row and the $4^{th}$ row of the array.

The benefit of the arrangement of the SPD C0 in FIG. 17 is to annihilate the severe EMI by its symmetry. Annihilating EMI by symmetry is elaborated below. During the transition time $T_{1=>2}$ (or equivalently, TT1 in FIG. 11), a first pulse current would flow/rush into the top electrodes of the elements 92_1 in the $1^{st}$ and $6^{th}$ rows. Meanwhile, during the transition time $T_{1=>2}$ (or equivalently, TT2 in FIG. 11), a second pulse current, with amplitude similar/close to the first pulse current, would flow/rush out of the top electrodes of the elements 92_2 in the $2^{nd}$ and $5^{th}$ rows. Thereby, a first EM (Electro Magnetic) radiation, generated between the elements 92_1 in the $1^{st}$ row and the elements 92_2 in the $2^{nd}$ row, would be 180 degree out of phase with a second EM radiation, generated between the elements 92_2 in the $5^{th}$ row and the elements 92_1 in the $6^{th}$ row. Due to the EMI interference being destructive, the first and the second EM radiations would auto-annihilate each other and result in a minimal net EM radiation. Same rationale also applies to the transition times $T_{2=>3}$ and $T_{3=>1}$.

Furthermore, in an embodiment, the bottom electrodes of some of the elements 92_1, 92_2 and 92_3, e.g., the bottom electrodes of the rightmost elements 92_1, 92_2 and 92_3, may also receive the voltage $V_B$.

Figure 18:
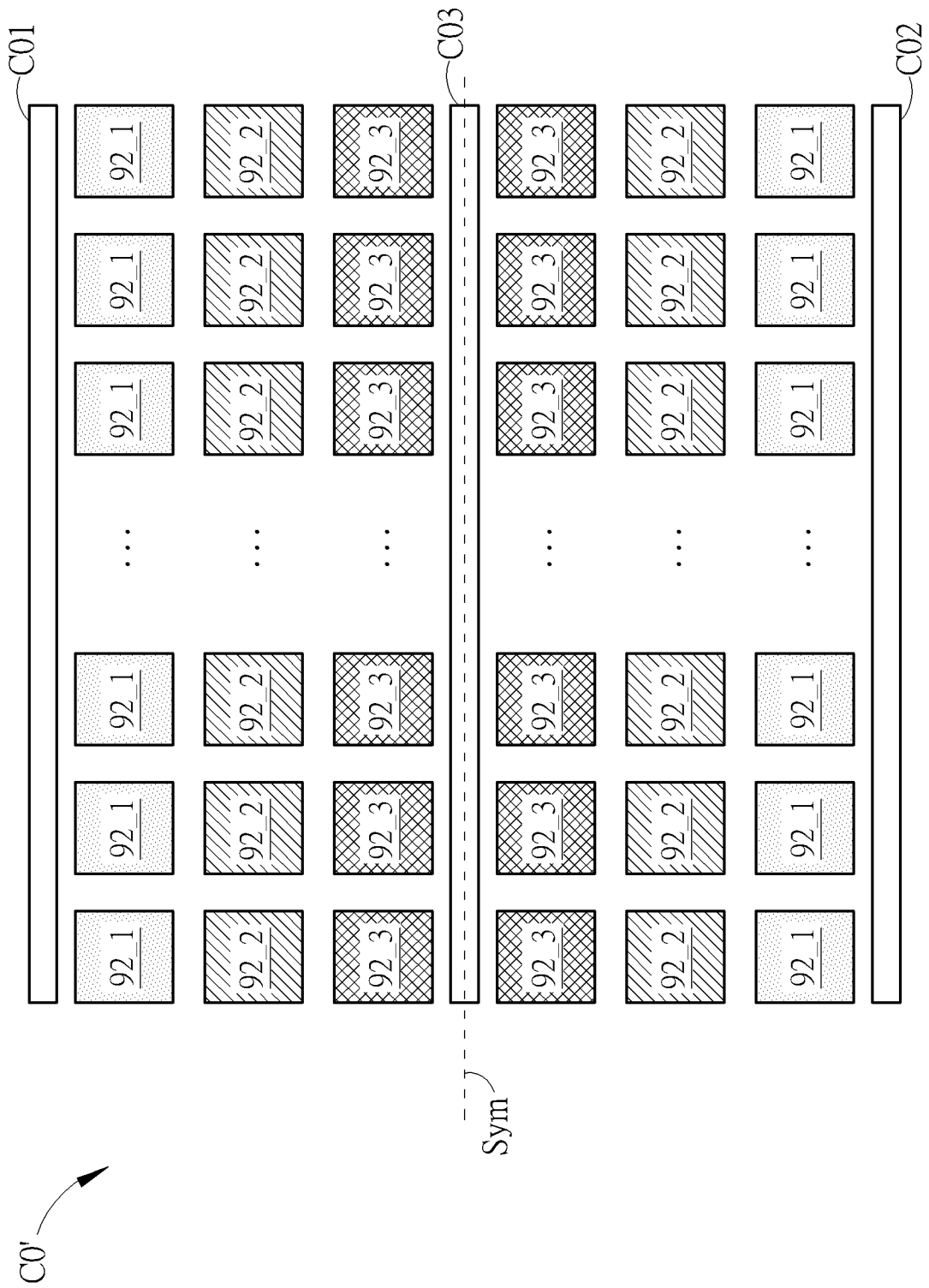
FIG. 18 is a schematic diagram of a sound producing device according to an embodiment of the present application.

FIG. 18 is a schematic diagram of an SPD C0' according to an embodiment of the present application. The SPD C0' is similar to the SPD C0. Different from the SPD C0, the SPD C0' further comprises conducting lines C01, C02 and C03. Similarly, the conducting lines C01, C02 and C03 are made of conductive material (such as metal), receive the voltage $V_B$, and play similar roles as the conducting lines B01 and B02. Function of the conducting line C01/C02 is to provide the voltage $V_B$ to the elements 92_1. Function of the conducting line C03 is to provide the voltage $V_B$ to the elements 92_3. The relationship between (and the rationale behind having) the conducting lines C01/C02 and C03 of FIG. 18 is the same as the relationship between (and the rationale behind having) the conducting lines B01 and B02 of FIG. 16.

Note that, referring back to FIG. 14, the label "1/2/3" in FIG. 14 may denote the electrical pulses EP_1/EP_2/EP_3, which is not limited thereto. The label "1" in FIG. 14 may refer to the electrical pulses EP_2 within the driving signal DS2 or the electrical pulses EP_3 with the driving signal DS3 as well. Similarly, the label "2" in FIG. 14 may refer to the electrical pulses EP_1 or the electrical pulses EP_3, and/or the label "3" in FIG. 14 may refer to the electrical pulses EP_1 or the electrical pulses EP_2, which depends on practical requirements.

Figure 21:
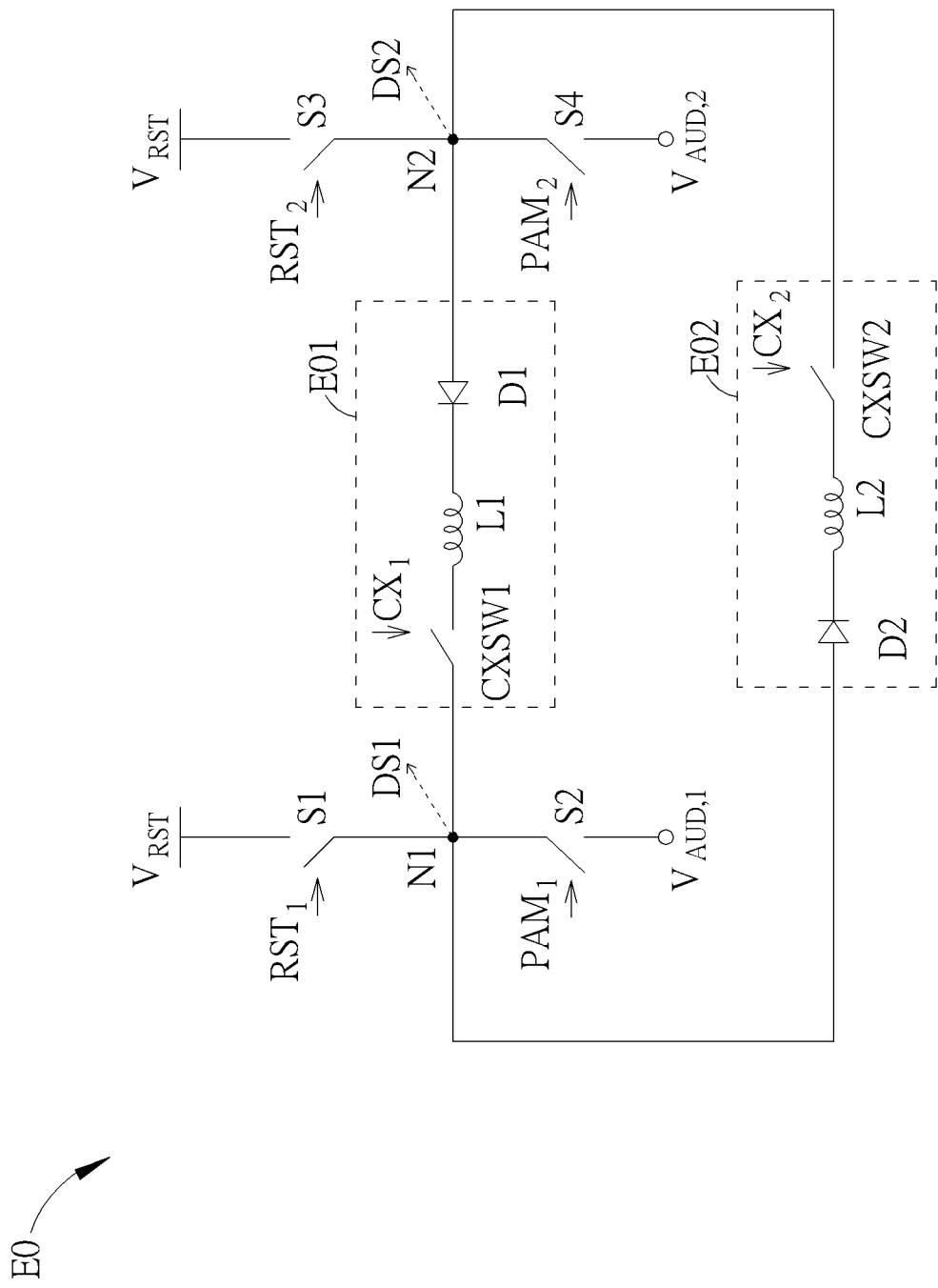
FIG. 21 is a schematic diagram of a driving circuit according to an embodiment of the present application.

In addition, topology of driving circuit generating the driving signals is not limited. FIG. 21 is a schematic diagram of a driving circuit E0 according to an embodiment of the present application. The driving circuit E0 may be configured to drive SPD (e.g., A0 shown in FIG. 12) comprising the air pulse generating elements 92_1, 92_2. Note that, in SPD A0, the element 92_1 may be disposed adjacent to the element 92_2, bottom electrodes of the elements 92_1 and 92_2 may be (electrically) connected and receives the voltage $V_B$, and the top electrodes 92_1T and 92_2T receives the driving signal DS1 and DS2, respectively.

As FIG. 21 shows, the driving circuit E0 comprises nodes N1, N2, swapping modules E01, E02 and switches S1-S4. The swapping module E01/E02 respectively comprises a charge-exchanging switch CXSW1/CXSW2, an inductor L1/L2 and a diode D1/D2 connected in series. The swapping modules E01, E02 are coupled between the nodes N1, N2. The nodes N1, N2 and the swapping modules E01, E02 are connected as a loop structure, which means that the node N1/N2 can be regarded as a beginning of the loop structure as well as an end of the loop structure.

The node N1 is coupled to the top electrode 92_1T of the air pulse generating element 92_1, configured to deliver the driving signal DS1 to the air pulse generating element 92_1 (i.e., to the top electrode 92_1T). Similarly, the node N2 is coupled to the top electrode 92_2T of the air pulse generating element 92_2, configured to deliver the driving signal DS2 to the air pulse generating element 92_2 (i.e., to the top electrode 92_2T). Note that, supposed that the air pulse generating element 92_1/92_2 is PZT actuated, a capacitance $C_{PZT,1}/C_{PZT,2}$ (not shown in FIG. 21) may exist between the node N1/N2 and the bottom electrode(s).

The switches S1-S2 are coupled to the node N1, and the switches S3-S4 are coupled to the node N2. Besides coupled to the nodes N1 and N2, a terminal of the switch S1 and a terminal of the switch S3 receive the voltage $V_{RST}$. A terminal of the switch S2 and a terminal of the switch S4 receive a signal $V_{AUD,1}$ and a signal $V_{AUD,2}$, respectively. $V_{AUD,1}$ and $V_{AUD,2}$ are two instances of samples of the input audio signal AUD, corresponding to the driving signals DS1 and DS2, respectively.

The switches S1 and S3 are controlled by reset control signals $RST_1$ and $RST_2$, respectively. The switches S2 and S4 are controlled by PAM control signals $PAM_1$ and $PAM_2$, respectively. The charge-exchanging switches CXSW1 and CXSW2 are controlled by charge-exchanging control signals $CX_1$ and $CX_2$, respectively.

The driving signal DS1/DS2 may be both SEAM signals, which means that the driving signal DS1/DS2 may be unipolar with respect to the voltage $V_{RST}$ (as taught in U.S. Pat. No. 10,771,893). In an embodiment, the voltage $V_{RST}$ may be sufficiently high such that the gap(s) would be formed on the membrane(s) within the air pulse generating element(s), especially when the air pulse generating element 92_1/92_2 shares structure similar to (or the same as) the air pulse generating element 10. In this regard, the voltage level of $V_{RST}$ may be higher than voltage levels of $V_{AUD,1}$ and $V_{AUD,2}$.

Figure 22:
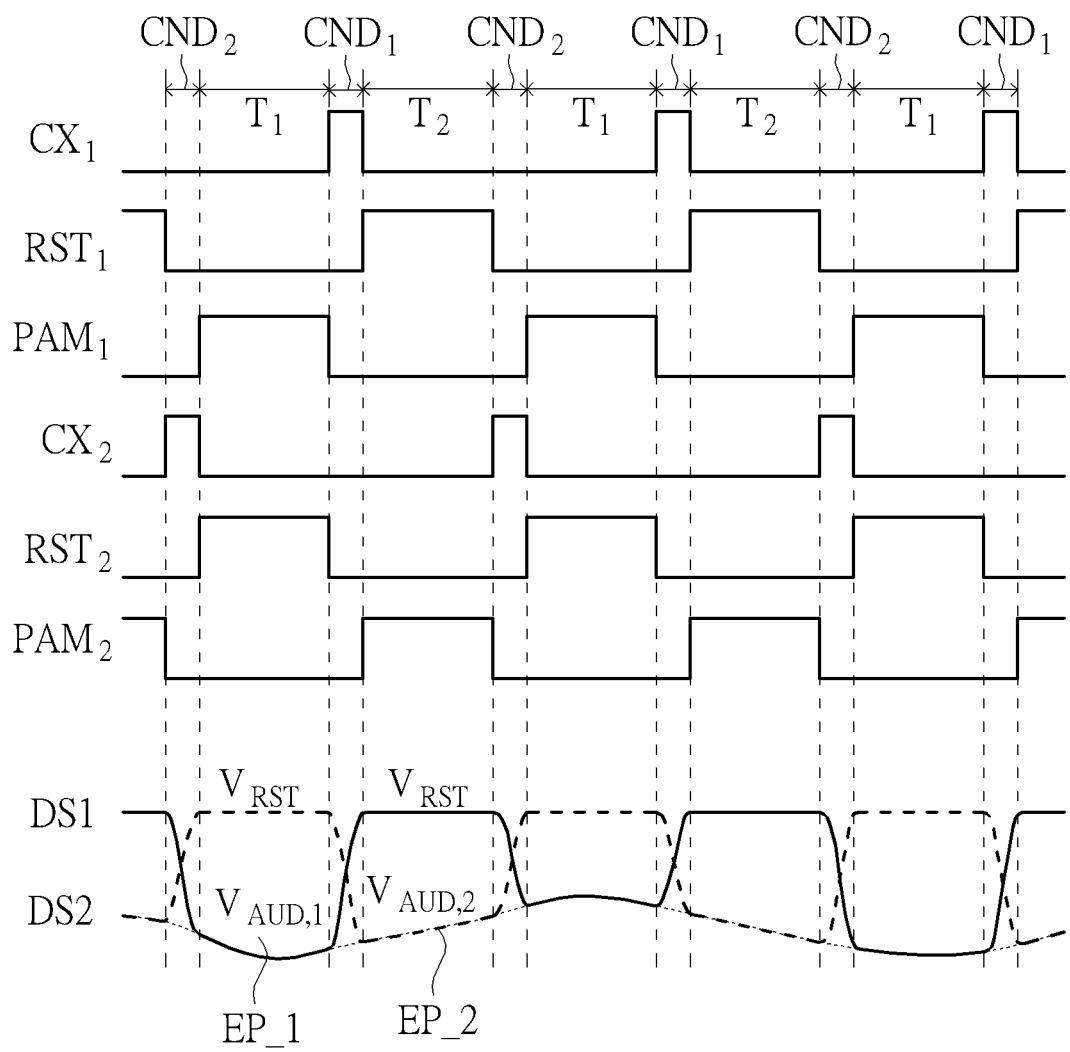
FIG. 22 is a schematic diagram of control signals for the driving circuit in FIG. 21.

Timing diagrams of control signals $RST_1$, $RST_2$, $PAM_1$, $PAM_2$, $CX_1$ and $CX_2$ are shown in FIG. 22. The driving signals DS1 and DS2 are also illustrated in bottom of FIG. 22. Instead of sampling $V_{AUD}$ at the start of the PAM phases and hold the voltage level throughout the PAM phases, in this embodiment, driving signals DS1 and DS2 will track the audio signal during the PAM phases. For illustration purpose, in the following description, the switch is conducting when the corresponding control signal is in high state (logic "1") and is non-conducting, or cut-off, when the corresponding control signal is in low state (logic "0").

CND1/CND2 represents time intervals during which the charge-exchanging switch CXSW1/CXSW2 is conducting while the switches S1~S4 are non-conducting and charge-exchanging switch CXSW2/CXSW1 is non-conducting.

During a period $T_1$, before a time interval CND1, switches S2, S3 are conducting and switches S1, S4, CXSW1, CXSW2 are cut-off, such that the driving signal DS1 at the node N1 would track the voltage level $V_{AUD}$ (labeled as $V_{AUD,1}$ to differentiate from that of CND2, which is labeled as $V_{AUD,2}$) and the driving signal DS2 at the node N2 would be the voltage level $V_{RST}$. Note that, at a beginning of the conduction interval CND1, a voltage level at the node N2 (i.e., $V_{RST}$) is higher than a voltage level at the node N1 (i.e., $V_{AUD,1}$).

After the start of the time interval CND1, when the charge-exchanging switch CXSW1 is turned ON and start conducting and the switches S1-S4, CXSW2 are all cutoff, current flow in inductor L1 can be described by $$I_{L1,t_i} = \int_{t=t_0}^{\tau_i} \frac{V_{N2} - V_f - V_{N1}}{L1} dt,$$

where $t_0$ corresponds to the start of time interval CND1, $V_{N1}$, $V_{N2}$ are voltage levels at nodes N1, N2 and $V_f$ is the forward conducting voltage of diode D1. The current flowing through L1 will keep increasing until $V_{N2}=V_{N1}+V_f$ where $I_{L1}$ reaches its peak and starts decreasing until the current reaches 0 and the diode D1 is turned off. Note that, during the course of $I_{L1}$ decreasing, $V_{N1}$ will swing toward $V_{RST}$ while $V_{N2}$ will swing toward $V_{AUD}$. In other words, during the interval CND1, assuming minimum energy losses due to $I_{L1} \cdot V_f$ and $R_{L1} \cdot I_{L1}^2$, by virtue of the inertia of inductor current $I_{L1}$, electrical charge stored in $C_{PZT,2}$ of node N2 will be transferred to $C_{PZT,1}$ of node N1, resulting in the voltage levels of node N1 and node N2 being swapped effectively. Similarly, during the interval CND2, assuming minimum energy losses due to $I_{L2} \cdot V_f$ and $R_{L2} \cdot I_{L2}^2$, by virtue of the inertia of inductor current $I_{L2}$, voltage levels at node N1 and node N2 will swapped effectively.

After the conduction interval CND1 (CND2) and during a period $T_2$ ($T_1$), the switches S1, S4 (S2, S3) are conducted and the switches S2, S3 (S1, S4) and CXSW1, CXSW2 are cutoff, the driving signal DS1 (DS2) at the node N1 (N2) would be near the voltage level $V_{RST}$ and the driving signal DS2 (DS1) at the node N2 (N1) would be near the voltage level $V_{AUD,2}$ ($V_{AUD,1}$).

Furthermore, during the conduction interval CND1 (CND2) toward the end of the conduction interval CND1 (CND1), the voltage level at the node N2 (N1) may overshoot or undershoot the voltage level $V_{AUD,2}$ ($V_{AUD,1}$) and, likewise, the voltage level at the node N1 (N2) may overshoot or undershoot the voltage level $V_{RST}$. Once the period $T_2$ ($T_1$) starts, and the switches S1, S4 (S2, S3) are conducting, the voltage level at the node N1 (N2) will be pulled to $V_{RST}$ and the voltage level at the node N2 (N1) will be pulled to $V_{AUD,2}$ ($V_{AUD,1}$).

Note that, the period $T_1$ represents the PAM phase of the driving signal DS1, and the period $T_2$ represents the PAM phase of the driving signal DS2. Furthermore, from the waveform illustrated in the bottom of FIG. 22, a rising edge of the driving signal DS1 and a falling edge of the driving signal DS2 are formed/coincided within the conduction interval CND1. Similarly, a falling edge of the driving signal DS1 and a rising edge of the driving signal DS2 are formed/coincided within the conduction interval CND2, by using (the same rationale of) the swapping module E02. In this case, the temporal interleaved electrical pulses EP_1 (within DS1) and electrical pulses EP_2 (within DS2) are generated, where transition edges of electrical pulses EP_1 and EP_2 coincide with each other and have inverse polarities.

Specifically, referring back to the swapping module E01 in FIG. 21 and the interval CND1 in FIG. 22 as an example, at the beginning of CND1, due to a voltage difference between the nodes N1 and N2, the inductor L1 would conduct a current (denoted as I1) from the node N2 to the node N1, and also play a role to resist current variation of the current I1. Besides, the inductor L1 and the capacitance $C_{PZT,1}/C_{PZT,2}$ may be viewed as form a LC oscillator. Nevertheless, the diode D1 included in the swapping module E01 functions as a rectifying component to allow the current flowing only from the node N2 to the node N1 and to block/prevent current I1 flowing from the node N1 back to the node N2. As a result, the current I1 from the node N2 to the node N1 would be drawn, which is equivalent to the amount of electrons (or charges) is transferred/removed from the capacitance $C_{PZT,1}$ at the node N1 to the capacitance $C_{PZT,2}$ at the node N2, during/after the conduction interval CND1.

By the same rationale, during/after the conduction interval CND2, the amount of electronics/charges would be (more or less) transferred back to the capacitance $C_{PZT,1}$ at the node N1, via the loop structure formed by the nodes N1, N2 and the swapping modules E01, E02. Furthermore, the conduction interval CND1 corresponding to transferring charges from the node N1 to N2 and the conduction interval CND2 corresponding to transferring charges from N2 back to the node N1 may take place within one (electrical) pulse cycle $T_{CY,E}$.

Thereby, by interleaving DS1/DS2 and by time align the transition PAM/RST phase transition edges of DS1/DS2, during the transitions (i.e., the rising/falling edges) of between the PAM phase and the RST phase of driving signals DS1/DS2, the energy stored in the piezo-speaker loading capacitance would be mostly recycled/reused, such that power consumption due to the PAM switching activities is significantly reduced. Therefore, the power consumed would be mainly determined by the envelop variation of the input audio signal AUD and largely independent of the PAM switching activities.

Figure 23:
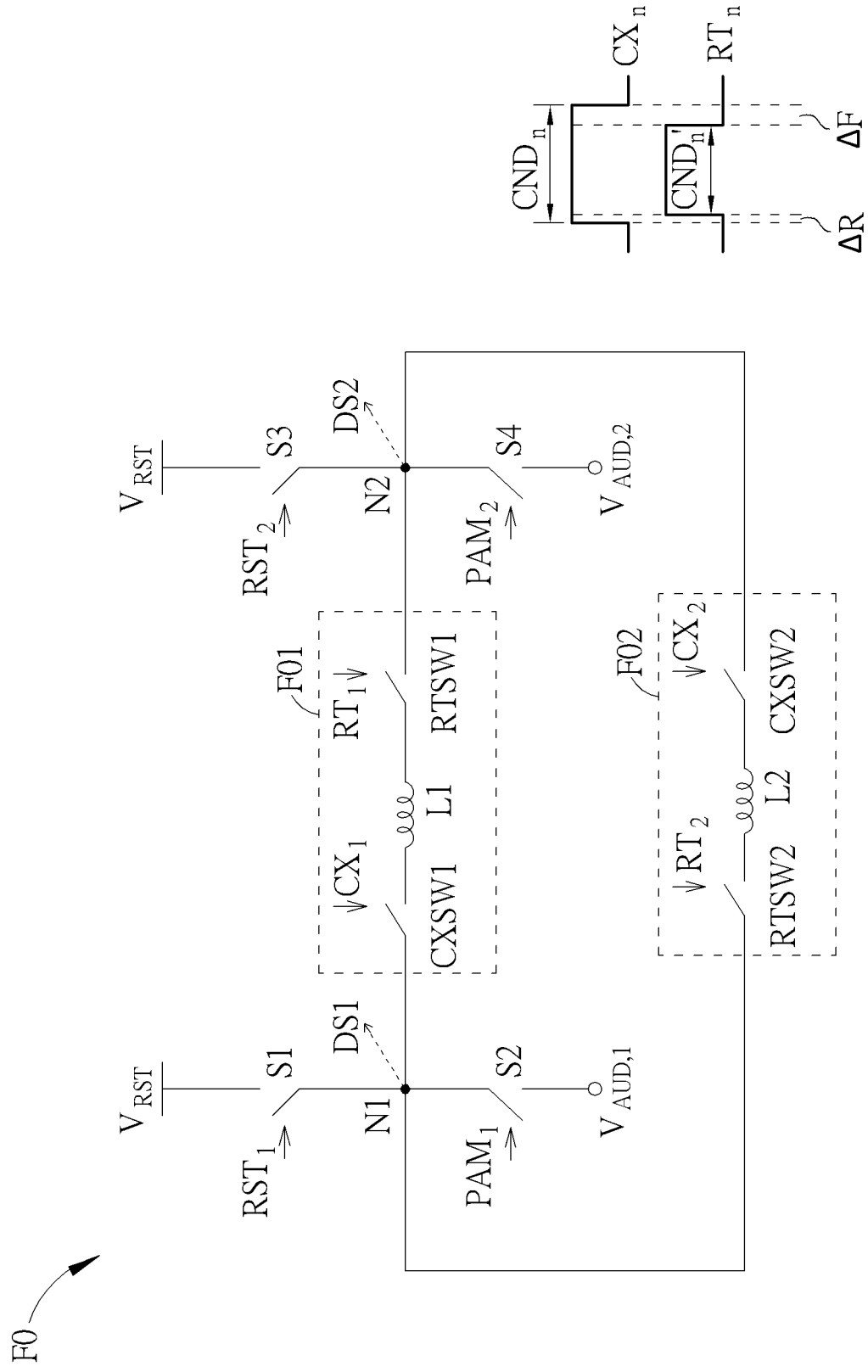
FIG. 23 is a schematic diagram of a driving circuit according to an embodiment of the present application.

Note that, in the embodiment shown in FIG. 21, diodes are used to perform the rectifying function, which is not limited thereto. Rectifying switches controlled by rectifying (control) signals may replace diodes in performing the rectifying function. For example, FIG. 23 is a schematic diagram of a driving circuit FO according to an embodiment of the present application. The driving circuit FO comprises swapping modules F01 and F02. The swapping module F01/F02 comprises a rectifying switch RTSW1/RTSW2. The rectifying switch RTSW1/RTSW2 is controlled by a rectifying signal $RT_1/RT_2$. In the present application, diodes and rectifying switches are regarded as rectifying components.

The rectifying signal $RT_1/RT_2$ controls the rectifying switch RTSW1/RTSW2 to be conducted within (but not out of) the conduction interval CDN1/CDN2, as shown in right portion of FIG. 23, to rectify the current flowing therethrough. In one embodiment zero crossing detection (ZCD) circuit (not shown in FIG. 23) may be included to generate the rectifying signal $RT_1/RT_2$ for the rectifying switch RTSW1/RTSW2, such that the rectifying switch RTSW1/RTSW2 will go from conducting to cutoff when the current flow through the inductor L1/L2 approaches zero, and replacing the rectifying function of diodes D1/D2 as a result.

Furthermore, ΔR in right portion of FIG. 23 represents a time gap between rising edges of $CX_n$ and $RT_n$, ΔR is known as dead-time in fields such as gate driver for class-D amplifier, and ΔF represents a time difference between falling edges of $CX_n$ and $RT_n$, where n=1 or 2 herein. ΔR (with ΔR≥0) and ΔF (with ΔF≥0) may be designed according to practical situation. Generally, ΔR corresponds to the time required to fully turn OFF S1~S4 and ΔF may be determined by a ZCD circuit.

Figure 24:
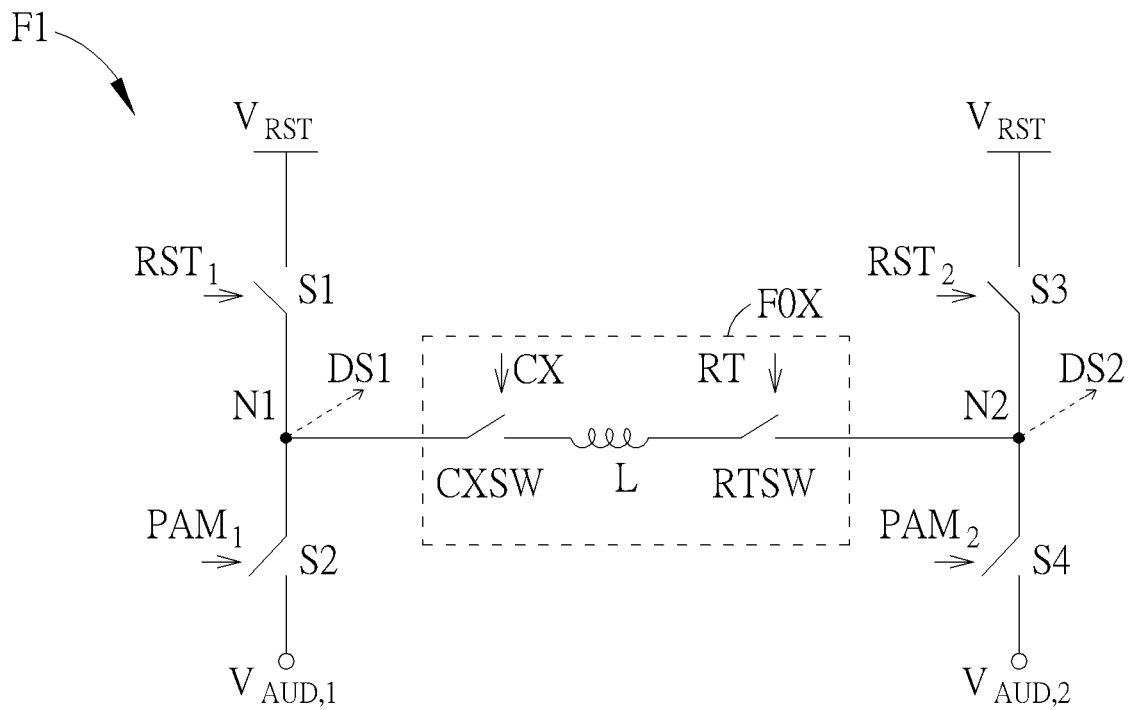
FIG. 24 is a schematic diagram of a driving circuit according to an embodiment of the present application.

Note that, the internal components of the swapping modules F01 and F02 are identical. The only difference between F01 and F02 is the control timing of those two switches. It is therefore possible to merge two swapping modules F01 and F02 into one, F0X as in FIG. 24, in which the swapping module F0X is treated as F01 during time interval DN1 and the swapping module F0X is treated as F02 during time interval DN2. By such substitution of control signals, the swapping module F0X will not only be able to draw current from the node N2 to the node N1, but also be able to draw current from the node N1 to the node N2. That is, using swapping module with rectifying switch brings flexibility of drawing current in two opposite directions while reducing the number of inductors required from two to one.

Figure 25:
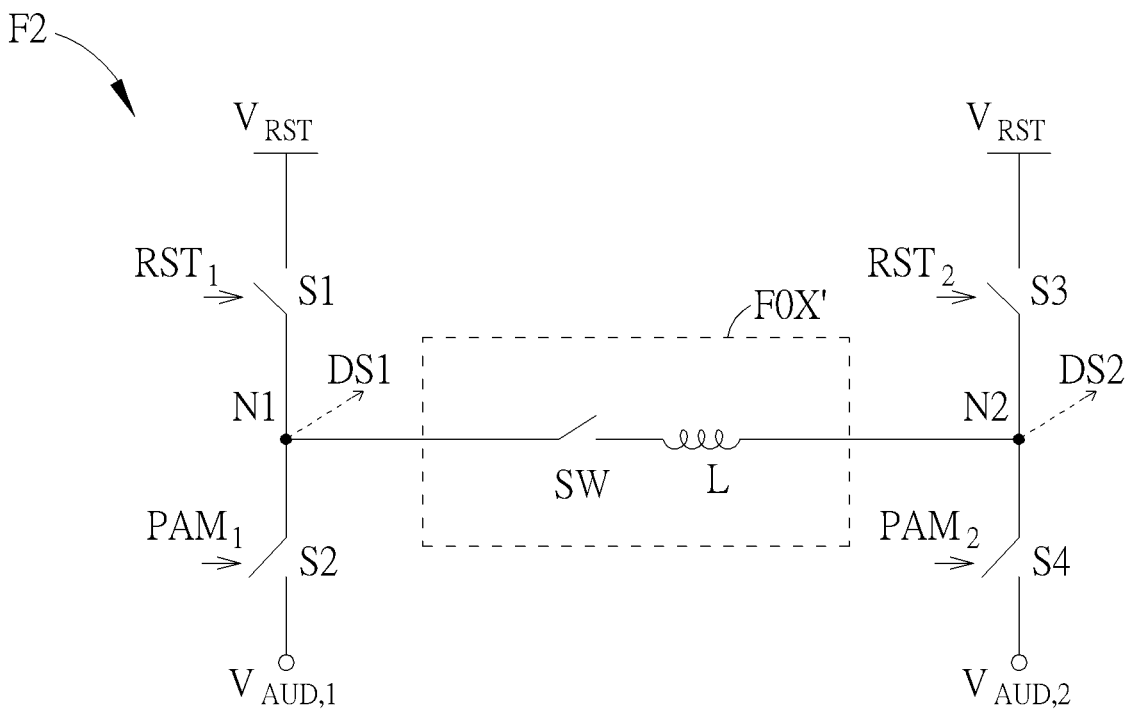
FIG. 25 is a schematic diagram of a driving circuit according to an embodiment of the present application.

Furthermore, it is known that two switches (controlled by signals, denoted as, e.g., $CSG_1$ and $CSG_2$) connected in series can be combined into one switch controlled by a control signal CSG=$CSG_1$ & $CSG_2$, where "&" represent a logic AND operation. In this regard, the switches CXSW and RTSW in FIG. 24 can be combined as one switch (denoted as SW), and a swapping module F0X' is formed and shown in FIG. 25. The control signal for the switch SW within the swapping module F0X' in FIG. 25 can be obtained by performing CX & RT, where CX and RT are control signals for the switches CXSW and RTSW, respectively, within the swapping module F0X shown in FIG. 24. Note that, the switch SW also plays a role of rectifying component, and the control signal thereof may be dependent on a result of the ZCD circuit.

In another aspect, the voltage level at the node N1 (equivalently, the driving signal DS1) and the voltage level at the node N2 (equivalently, the driving signal DS2) are substantially swapped, at the end of interval CND1. For example, in the case of the circuit E0 shown in FIG. 21, before the conduction interval CND1, the voltage level at node N2 is approximately $V_{RST}$, higher than the voltage level at node N1, which is approximately at $V_{AUD,1}$; after the conduction interval CND1 ends, the voltage level of node N1 is increased up toward $V_{RST}$ and the voltage level of node N2 is decreased down toward $V_{AUD,1}$, close to $V_{AUD,2}$. In this case, the voltage levels at node N1 and node N2 are considered to be "substantially swapped" after the conduction interval CND1.

In addition, a general situation would also be considered as "voltage level of node N1 and voltage level of node N2 is substantially swapped." That is, before the conduction interval CND1, the voltage level of node N1 is smaller than a certain threshold and the voltage level of node N2 is larger than the certain threshold; after the conduction interval CND1 ends, the voltage level of node N1 is increased up to be larger than the certain threshold and the voltage level of node N2 is decreased down to be smaller than the certain threshold. In this case, the voltage levels of N1 and N2 are considered to be "substantially swapped" after the conduction interval CND1. In an embodiment, the certain threshold may refer to the voltage level obtained by performing pure charge-sharing operation between the capacitance $C_{PZT,1}$ at the node N1 and the capacitance $C_{PZT,2}$ at the node N2.

Figure 26:
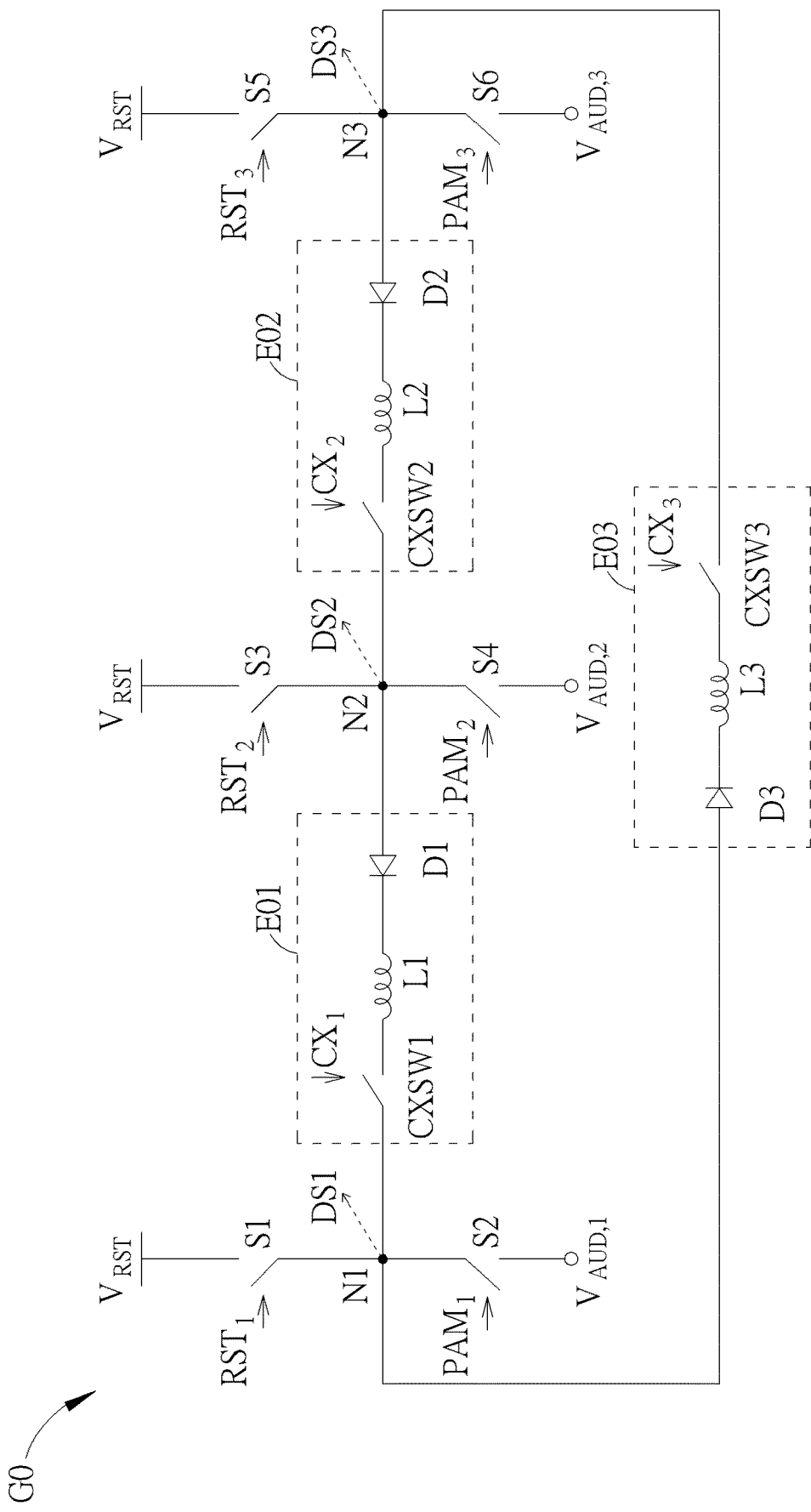
FIG. 26 is a schematic diagram of a driving circuit according to an embodiment of the present application.

FIG. 26 is a schematic diagram of a driving circuit G0 according to an embodiment of the present application. The driving circuit G0 may be configured to drive SPD comprising the air pulse generating elements 92_1-92_3, e.g., the SPDs 90, A0', B0, B0', C0, C0', in which the driving signal DS1-DS3 are required, where the element(s) 92_1 is disposed adjacent to the element(s) 92_2 and the element(s) 92_2 is disposed adjacent to the element(s) 92_3. Similarly, the bottom electrodes of the elements 92_1-92_3 may be (electrically and physically) connected and receive the voltage $V_B$, and the top electrodes 92_1T-92_3T receives the driving signals DS1-DS3, respectively.

In addition to components within the driving circuit E0, the driving circuit G0 further comprises a node N3 and a swapping module E03, where the swapping module E03 comprises a charge-exchanging switch CXSW3, an inductor L3 and a diode D3 connected in series, similar to the swapping module E01/E02. A capacitance $C_{PZT,3}$ (not shown in FIG. 24) may exist between the node N3 and the bottom electrode of the element 92_3. In the driving circuit G0 shown in FIG. 26, the swapping module E02 is coupled between the nodes N2 and N3, and the swapping module E03 is coupled between the nodes N3 and N1. Similar to the driving circuit E0, the nodes N1-N3 and the swapping module E01-E3 as shown in FIG. 26 also forms a loop structure, which means that any of the nodes N1-N3 may be regarded as a beginning as well as an end terminal of the loop structure.

Figure 27:
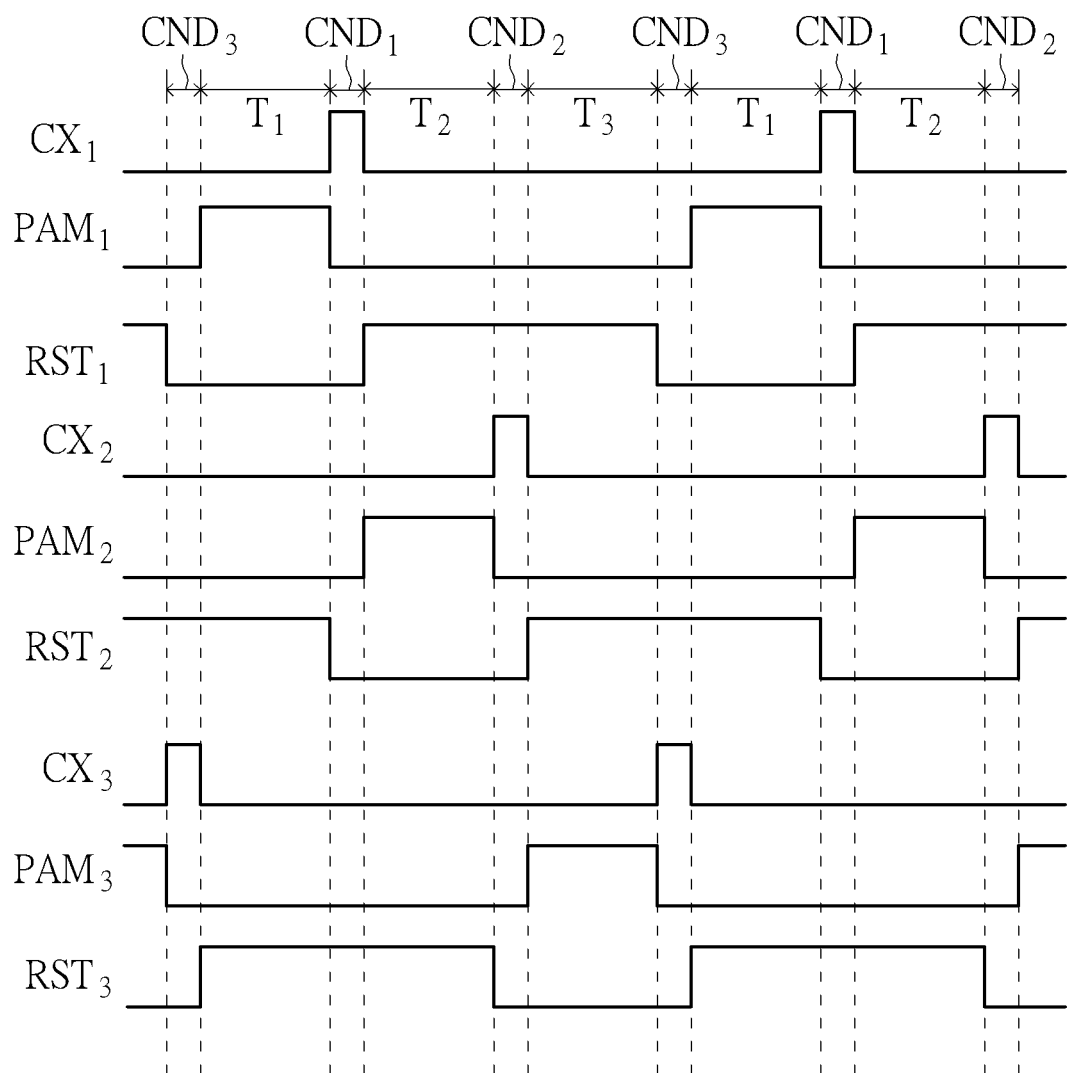
FIG. 27 is a schematic diagram of control signals for the driving circuit in FIG. 24.

Timing diagram of control signals for the driving circuit G0 are shown in FIG. 27. The swapping modules E01-E03, coupled between the nodes N1-N3, are conducted within the conduction interval CND1-CND3, respectively, and the swapping modules E01-E03 can be regarded as iteratively conducted. Similar to the operation of the driving circuit E0, within the conduction interval CND1 (corresponding to the transition time $T_{1=>2}$ shown in FIG. 14), an amount of electrons/charges stored in the capacitance/capacitor $C_{PZT,1}$ at the node N1 is transferred to the capacitance/capacitor $C_{PZT,2}$ at the node N2. Within the conduction interval CND2 (corresponding to the transition time $T_{2=>3}$ shown in FIG. 14), an amount of charges in the capacitance/capacitor $C_{PZT,2}$ at the node N2 is transferred to the capacitance/capacitor $C_{PZT,3}$ at the node N3. Within the conduction interval CND3 (corresponding to the transition time $T_{3=>1}$ shown in FIG. 14), an amount of charges in the capacitance/capacitor $C_{PZT,3}$ at the node N3 is transferred back to the capacitance/capacitor $C_{PZT,1}$ at the node N1. In addition, via the loop structure formed within the driving circuit G0, charges may be transferred from the capacitance/capacitor $C_{PZT,2}$ at the node N1, relayed through the capacitance/capacitor $C_{PZT,2}$ at node N2, the capacitance/capacitor $C_{PZT,3}$ at node N3 and transferred back to the capacitor $C_{PZT,1}$ at the node N1, within a time of the electrical pulse cycle $T_{CY,E}$ (shown in FIG. 7 and FIG. 14), where the driving signals DS1-DS3 would all have the electrical pulse cycle $T_{CY,E}$. Therefore, energy stored in the piezo speaker loading capacitance $C_{PZT,1}$, $C_{PZT,2}$ and $C_{PZT,3}$ would be recycled/reused and power consumed by SPD is mainly determined by the envelop of the input audio signal AUD.

In practice, approximately 60~88% energy recycling is achievable. Such energy recycling is particularly important for generating SEAM driving signals of the present invention where the (reset) voltage $V_{RST}$ may be required to be sufficiently high (i.e. significantly higher than a threshold) to create sufficient large Z-direction gaps (e.g., 110a) on the membrane in order to accelerate the pressure balancing of FIG. 19, reducing the area of 204*  to the area of 204.

Figure 28:
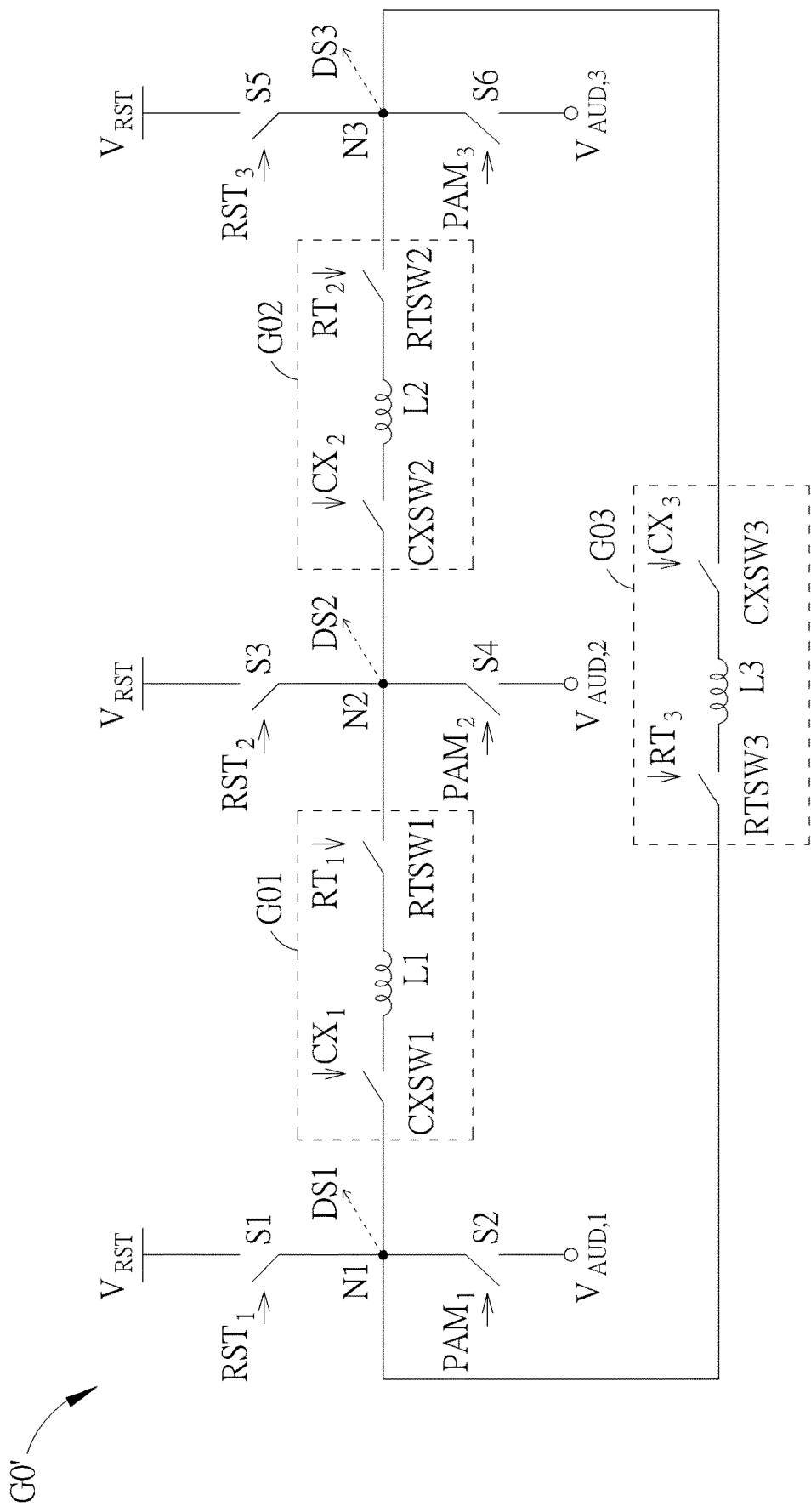
FIG. 28 is a schematic diagram of a driving circuit according to an embodiment of the present application.

Similar to the discussion of FIG. 23, the diodes in the driving circuit G0 may be replaced by the rectifying switches. FIG. 28 is a schematic diagram of a driving circuit G0' according to an embodiment of the present application. Details of the driving circuit G0' may be referred to paragraphs stated in the above, which is not narrated herein for brevity.

Figure 29:
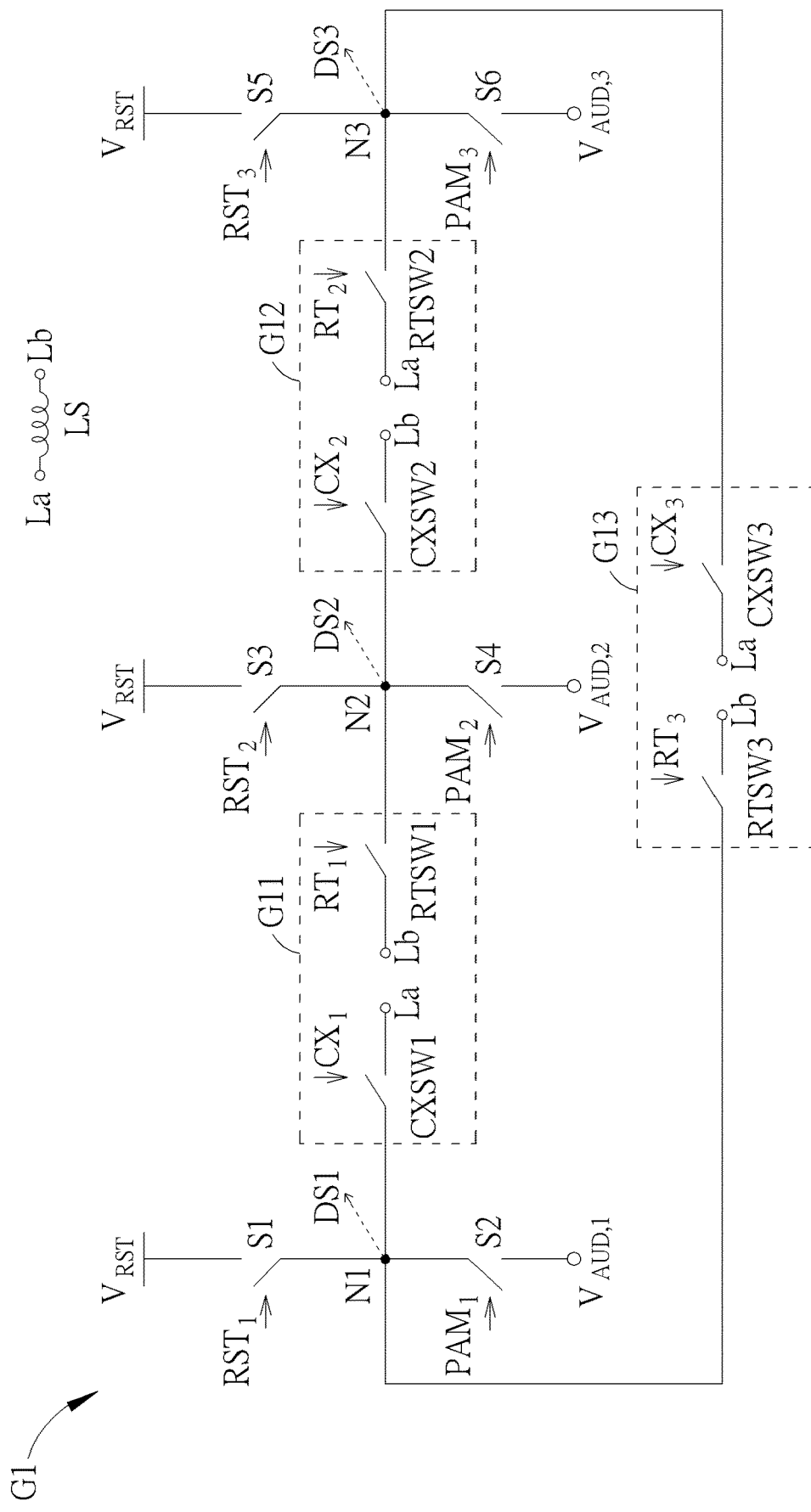
FIG. 29 is a schematic diagram of a driving circuit according to an embodiment of the present application.

Moreover, since at any moment only 1 instance of the swapping modules G01-G03 is active, so it is possible to share the inductors, as illustrated by a driving circuit G1 in FIG. 29. Different from FIG. 28, the inductors L1-L3 in FIG. 28 are replaced by a shared inductor LS within the driving circuit G1 in FIG. 29, where the shared inductor LS is shared by swapping modules G11-G13 within the driving circuit G1. In addition, the two terminals of the shared inductor LS are labeled as La and Lb and the wirings within G11-G13 indicates the connection to the shared inductor LS.

Further note that, the switches RSTW1 and CXSW2 actually have the same wiring, so that they can be merged physically, but need to be controlled with control signal appropriate for function expected of their "role". Similarly, the switches RSTW2 and CXSW3 can also be merged physically.

Figure 30:
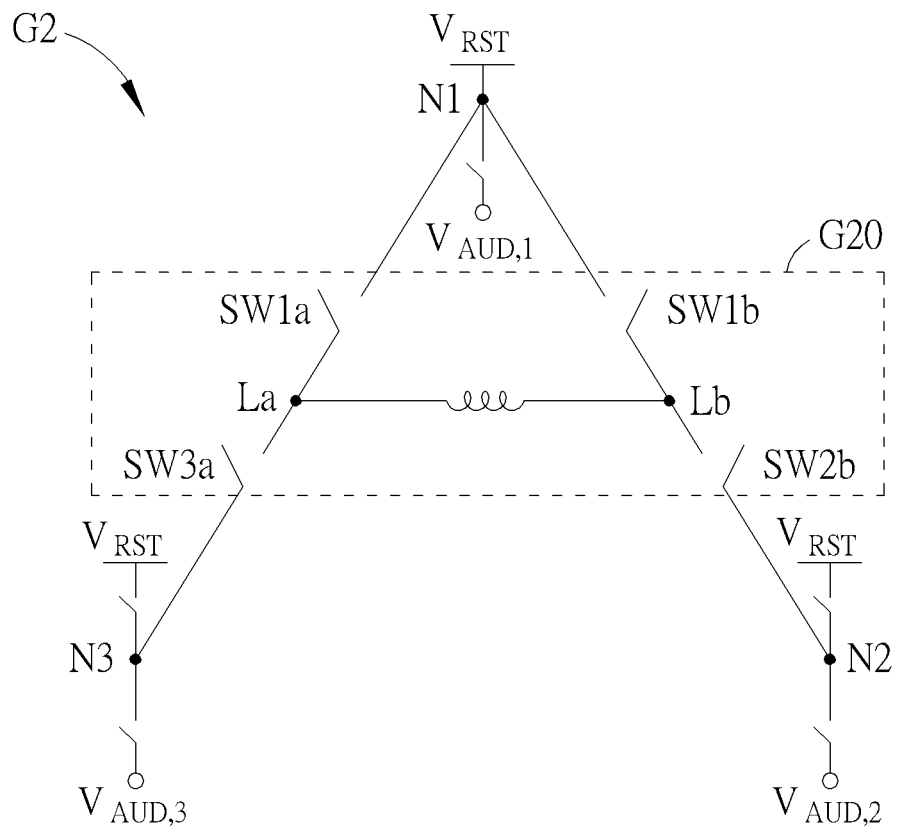
FIG. 30 is a schematic diagram of a driving circuit according to an embodiment of the present application.

In other words, the switches RSTW1 and CXSW2 in the driving circuit G1 may be merged as a switch, denoted as SW2b, connecting the node N2 and the terminal Lb; the switches RSTW2 and CXSW3 in the driving circuit G1 may be merged as a switch, denoted as SW3a, connecting the node N3 and the terminal La. The driving circuit G1 may be manipulated/simplified as a driving circuit G2, which is illustrated in FIG. 30. In the driving circuit G2, the switch SW1a (connecting the node N1 and the terminal La) is equivalent to the switch CXSW1 of the driving circuit G1, and the switch SW1b (connecting the node N1 and the terminal Lb) is equivalent to the switch RTSW1 of the driving circuit G1. In this case, during the conduction interval CND1, the switches SW1a and SW2b are conducted; during the conduction interval CND2, the switches SW2b and SW3a are conducted; during the conduction interval CND3, the switches SW1b and SW3a are conducted.

Figure 31:
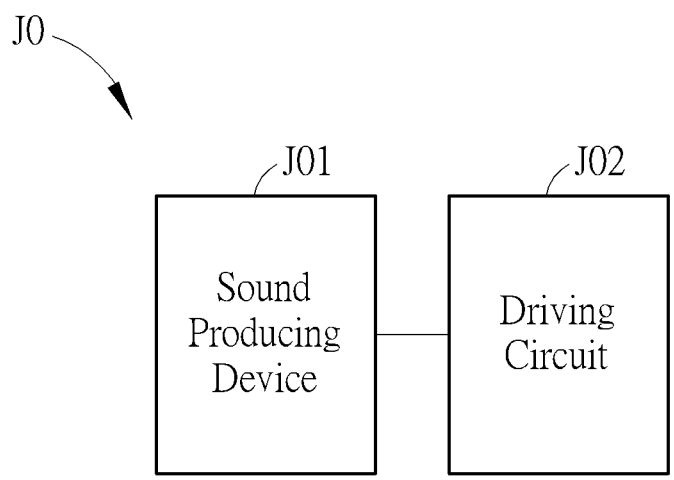
FIG. 31 is a schematic diagram of a sound producing apparatus according to an embodiment of the present application.

FIG. 31 is a schematic diagram of a sound producing apparatus J0 according to an embodiment of the present application. The sound producing apparatus J0 comprises a sound producing device J01 and a driving circuit J02. The SPD J01 and the driving circuit J02 may be properly chosen from the SPDs and the driving circuits stated in the above, depending on practical requirements.

Notably, the embodiments stated in the above are utilized for illustrating the concept of the present application. Those skilled in the art may make modifications and alterations accordingly, and not limited herein. For example, the air pulse generating elements driven by the driving circuits are not limited to be PZT actuated. Other actuating material may be exploited. Nevertheless, the driving circuits of the present application are especially suitable for actuator with capacitance formed between top and bottom electrodes. In addition, an order of the charge-exchanging switch, the inductor and the rectifying component within the swapping module is not limited. As long as they are connected in series within the swapping module, the requirement of the present application is satisfied, which is also within the scope of the present application.

In summary, the present application utilizes the temporarily opened slit openings to reduce the pressure balancing time, so as to enhance SPL performance; the present application arranges the air pulse generating elements in neighbor and drives the neighboring air pulse generating elements by electrical pulses with coinciding falling and rising transition edges, so as to reduce power consumption and EMI; the present application utilizes swapping modules to exchange electronic charges between the nodes, so as to save energy.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A driving circuit, configured to drive at least a first air pulse generating element and at least a second air pulse generating element within a sound producing device, the driving circuit comprising:
   a first node, coupled to the at least a first air pulse generating element, wherein the driving circuit produces a first driving signal to the at least a first air pulse generating element via the first node;
   a second node, coupled to the at least a second air pulse generating element, wherein the driving circuit produces a second driving signal to the at least a second air pulse generating element via the second node; and
   a first swapping module, coupled to the first node and the second node, configured to be conducted within a first conduction interval;
   wherein a first voltage level at the first node and a second voltage level at the second node are substantially swapped after the first conduction interval.

2. The driving circuit of claim 1, wherein the first node is coupled to at least a first top electrode of the at least a first air pulse generating element, the second node is coupled to at least a second top electrode of the at least a second air pulse generating element, bottom electrodes of the at least a first air pulse generating element and the at least a second air pulse generating element are connected.

3. The driving circuit of claim 1, wherein the at least a second air pulse generating element is disposed adjacent to the at least a first air pulse generating element.

4. The driving circuit of claim 1, wherein the first swapping module comprises a first inductor and a first switch.

5. The driving circuit of claim 4, wherein the first swapping module comprises a first rectifying component, the first rectifying component comprises a first diode or a first rectifying switch controlled by a first rectifying signal.

6. The driving circuit of claim 1, comprising:
   a first switch and a second switch, wherein the first switch and the second switch are coupled to the first node; and
   a third switch and a fourth switch, wherein the third switch and the fourth switch are coupled to the second node.

7. The driving circuit of claim 6, wherein
   a first terminal of the first switch receives a voltage;
   a second terminal of the second switch receives a first instantaneous sample of an input audio signal;
   a first terminal of the third switch receives the voltage;
   a second terminal of the fourth switch receives a second instantaneous sample of the input audio signal.

8. The driving circuit of claim 7, wherein
   the first switch is cutoff and the second switch is conducted during a first period before the first conduction interval;
   the third switch is conducted and the fourth switch is cutoff during a second period after the first conduction interval;
   during the first conduction interval, the first switch, the second switch, the third switch and the fourth switch are cutoff.

9. The driving circuit of claim 1, comprising:
   a second swapping module, coupled to the first node and the second node, configured to be conducted within a second conduction interval.

10. The driving circuit of claim 9, wherein the second swapping module comprises a second inductor and a second switch.

11. The driving circuit of claim 1, wherein the driving circuit is further configured to drive at least a third air pulse generating element within the sound producing device, and the driving circuit comprises:
    a third node, coupled to the at least a third air pulse generating element, wherein the driving circuit produces a third driving signal to the at least a third air pulse generating element via the third node.

12. The driving circuit of claim 11, wherein
    the first node of the driving circuit is coupled to at least a first top electrode of the at least a first air pulse generating element;
    the second node is coupled to at least a second top electrode of the at least a second air pulse generating element;
    the third node of the driving circuit is coupled to at least a third top electrode of the at least a third air pulse generating element;
    bottom electrodes of the at least a first air pulse generating element, the at least a second air pulse generating element and the at least a third air pulse generating element are electrically connected;
    the at least a second air pulse generating element is disposed adjacent to the at least a first air pulse generating element;
    the at least a third air pulse generating element is disposed adjacent to the at least a second air pulse generating element.

13. The driving circuit of claim 11, comprising:
    a second swapping module, coupled to the second node and the third node, configured to be conducted within a second conduction interval; and
    a third swapping module, coupled to the third node and the first node, configured to be conducted within a third conduction interval.

14. The driving circuit of claim 13, wherein
    the second swapping module comprises a second inductor and a second switch;
    the third swapping module comprises a third inductor and a third switch.

15. The driving circuit of claim 14, wherein
    the second swapping module comprises a second rectifying component, the second rectifying component comprises a second diode or a second rectifying switch controlled by a second rectifying signal;
    the third swapping module comprises a third rectifying component, the third rectifying component comprises a third diode or a third rectifying switch controlled by a third rectifying signal.

16. The driving circuit of claim 11, comprising:
    a first switch and a second switch, wherein the first switch and the second switch are coupled to the first node;
    a third switch and a fourth switch, wherein the third switch and the fourth switch are coupled to the second node; and
    a fifth switch and a sixth switch, wherein the fifth switch and the sixth switch are coupled to the third node.

17. The driving circuit of claim 16, wherein
a first terminal of the first switch receives a voltage;
a second terminal of the second switch receives a first instantaneous sample of an input audio signal;
a first terminal of the third switch receives the voltage;
a second terminal of the fourth switch receives a second instantaneous sample of the input audio signal;
a first terminal of the fifth switch receives the voltage;
a second terminal of the sixth switch receives a third instantaneous sample of the input audio signal.

18. The driving circuit of claim 11, wherein the first swapping module comprises:
an inductor, comprising a first terminal and a second terminal;
a seventh switch, coupled between the first node and the first terminal;
an eighth switch, coupled between the second node and the second terminal;
a ninth switch, coupled between the first node and the second terminal; and
a tenth switch, coupled between the third node and the first terminal.

19. The driving circuit of claim 18, wherein
the seventh switch and the eighth switch are conducted within the first conduction interval;
the eighth switch and the tenth switch are conducted within the second conduction interval;
the ninth switch and the tenth switch are conducted within the third conduction interval.

20. The driving circuit of claim 1, wherein the first driving signal comprises a plurality of first electrical pulses, the plurality of first electrical pulses has the same polarity with respect to a voltage.

21. The driving circuit of claim 20, wherein the first air pulse generating element comprises a first membrane and a first actuator disposed on the first membrane, a first gap is formed on the first membrane when the voltage is applied to the first actuator.

22. A driving circuit, configured to generate a plurality of driving signals to drive a sound producing device comprising a plurality of air pulse generating elements, comprising:
at least a swapping module, coupled between a plurality of nodes;
wherein the plurality of nodes is coupled to the plurality of air pulse generating elements;
wherein within a first conduction interval, a first amount of electrons is transferred from a first node;
wherein within a second conduction interval, a second amount of electrons is transferred back to the first node.

23. The driving circuit of claim 22, wherein the plurality of nodes is respectively coupled to a plurality of top electrodes of the plurality of air pulse generating elements, bottom electrodes of the plurality of air pulse generating elements are connected.

24. The driving circuit of claim 22, wherein the plurality of driving signals is unipolar with respect to a voltage.

25. The driving circuit of claim 24, wherein the voltage is sufficient high such that a gap is formed on a membrane within one air pulse generating elements among the plurality of air pulse generating elements.

26. The driving circuit of claim 22, wherein one swapping module among the swapping modules comprises an inductor, a charge-exchanging switch and a rectifying component connected in series, and the rectifying component comprises a diode or a rectifying switch controlled by a rectifying signal.

27. The driving circuit of claim 22, wherein the plurality of driving signals has a pulse cycle, the first amount of electronic charges is transferred from the first node and the second amount of electronic charges is transferred back to the first node within a time of the pulse cycle.

28. The driving circuit of claim 22, wherein the plurality of nodes and the at least a swapping module form a loop structure.

* * * * *